(12) United States Patent
Komai

(10) Patent No.: US 8,995,214 B2
(45) Date of Patent: Mar. 31, 2015

(54) NONVOLATILE SEMICONDUCTOR MEMORY

(71) Applicant: Kabushiki Kaisha Toshiba, Minato-ku, Tokyo (JP)

(72) Inventor: Hiromitsu Komai, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 2 days.

(21) Appl. No.: 13/831,520

(22) Filed: Mar. 14, 2013

(65) Prior Publication Data

US 2014/0173182 A1    Jun. 19, 2014

Related U.S. Application Data

(60) Provisional application No. 61/738,948, filed on Dec. 18, 2012.

(51) Int. Cl.
*G11C 7/00* (2006.01)
*G06F 3/06* (2006.01)
*G06F 13/38* (2006.01)
*G11C 16/00* (2006.01)

(52) U.S. Cl.
CPC .............. *G06F 3/0646* (2013.01); *G06F 13/38* (2013.01); *G11C 16/00* (2013.01)
USPC .......................................... 365/203; 365/204

(58) Field of Classification Search
CPC ........ G11C 7/12; G11C 7/18; G11C 13/0026; G11C 13/003

USPC ............. 365/203, 27, 63, 145, 148, 122, 185, 365/189, 230, 204

See application file for complete search history.

(56) References Cited

U.S. PATENT DOCUMENTS

| 2003/0058730 A1* | 3/2003 | Suzuki et al. ............ 365/230.03 |
| 2010/0238723 A1* | 9/2010 | Komai ...................... 365/185.03 |
| 2011/0261631 A1* | 10/2011 | Yoshida et al. .......... 365/189.11 |

* cited by examiner

*Primary Examiner* — Alexander Sofocleous
*Assistant Examiner* — Muhammad Islam
(74) *Attorney, Agent, or Firm* — Holtz, Holtz, Goodman & Chick PC

(57) ABSTRACT

According to one embodiment, a memory includes a temporary storage area which temporary stores data in a read/write operation to an array. The temporary storage area comprises a clamp FET connected between a first data bus and a second data bus, a first precharge FET connected between the first data bus and first potential, a second precharge FET connected between the second data bus and the first potential, a first storage area connected to the first data bus, and a second storage area connected to the second data bus. The control circuit is configured to generate a precharge state in which the first data bus is precharged to the first potential and the second data bus is precharged to a second potential lower than the first potential, when the data is transferred from the second storage area to the first storage area.

20 Claims, 23 Drawing Sheets

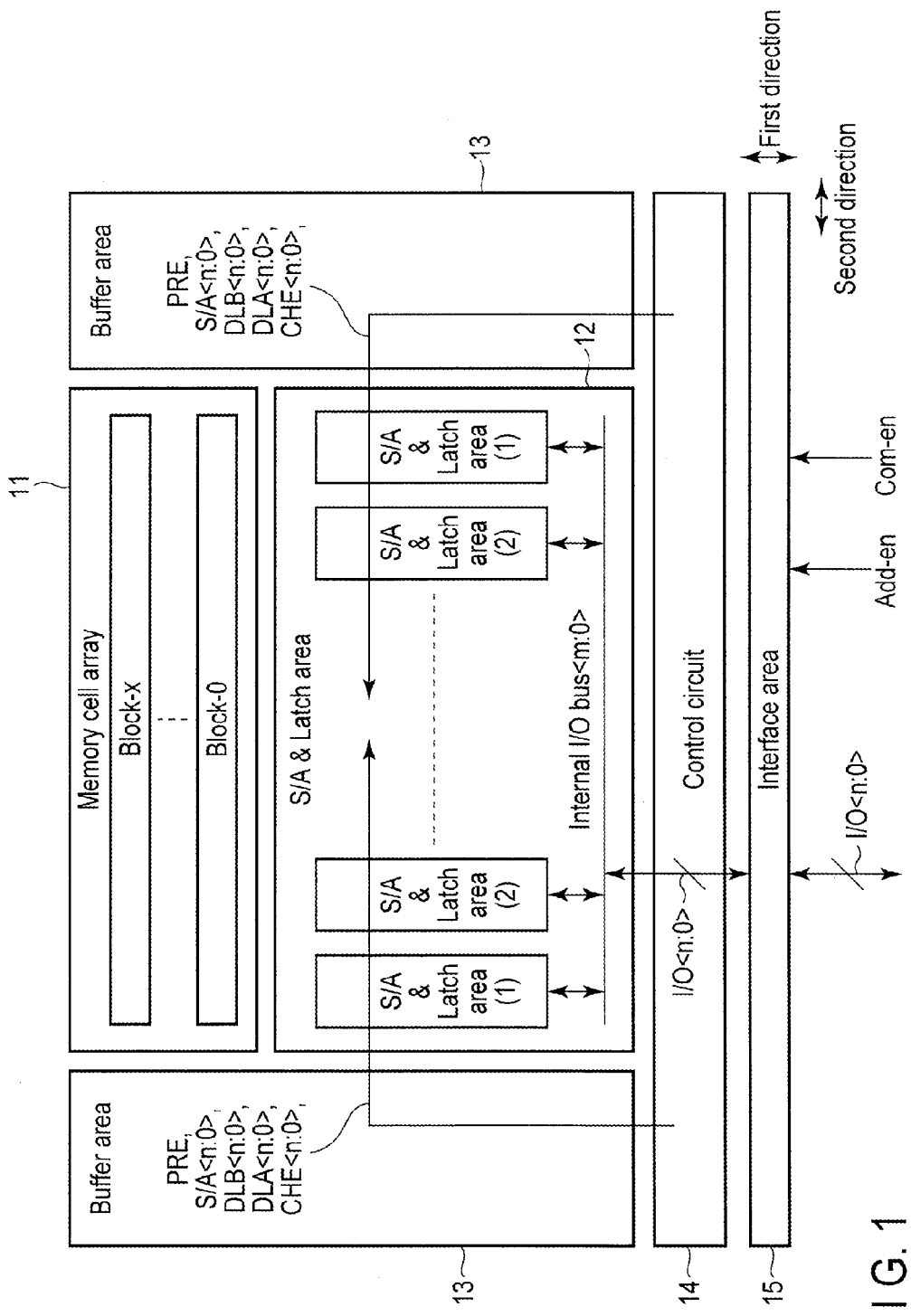
F I G. 1

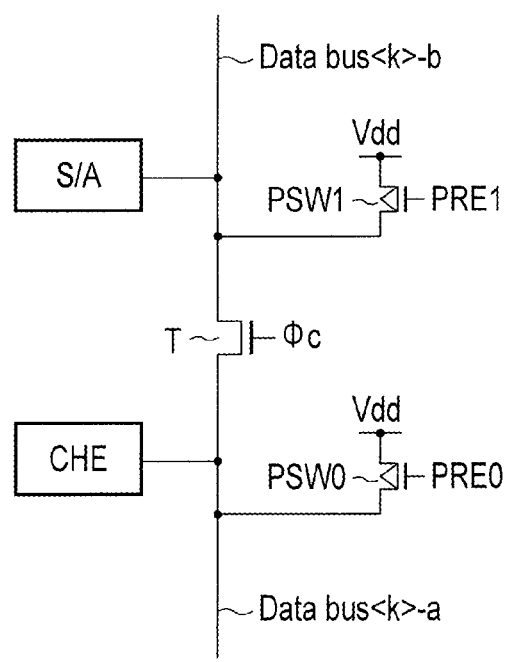
F I G. 11

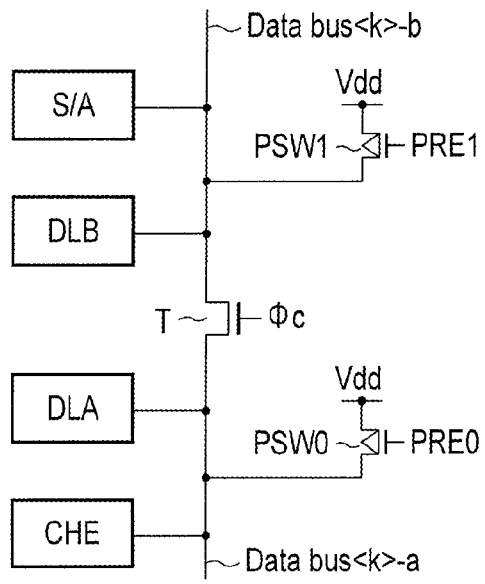
F I G. 12
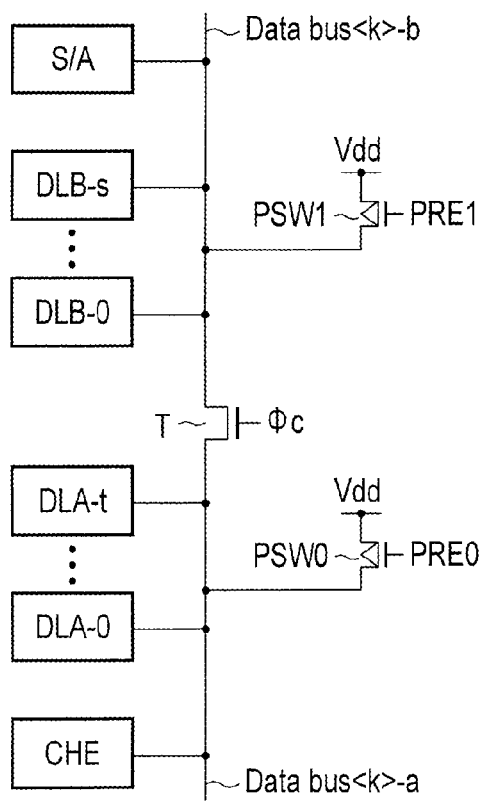
F I G. 13

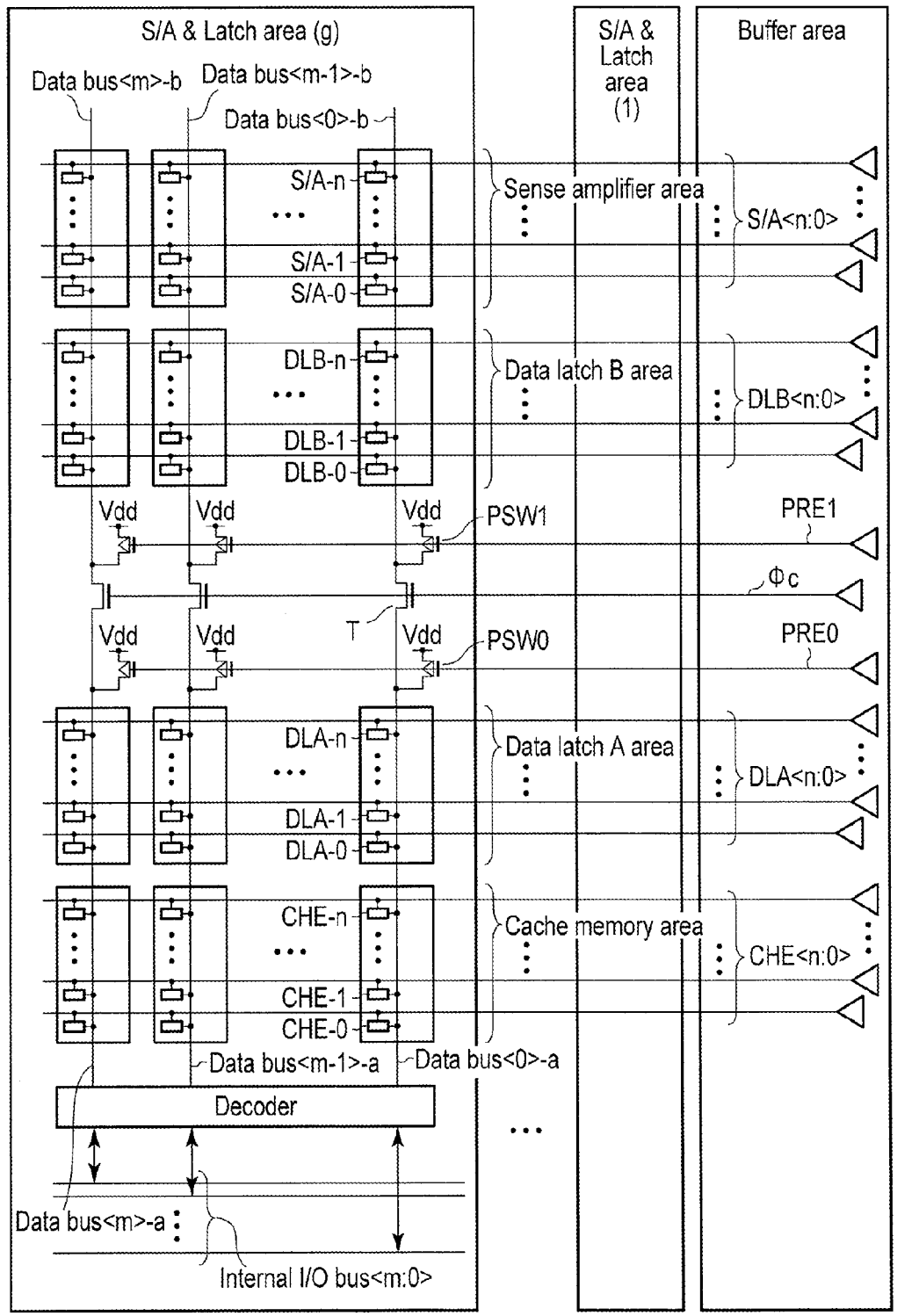
F I G. 15

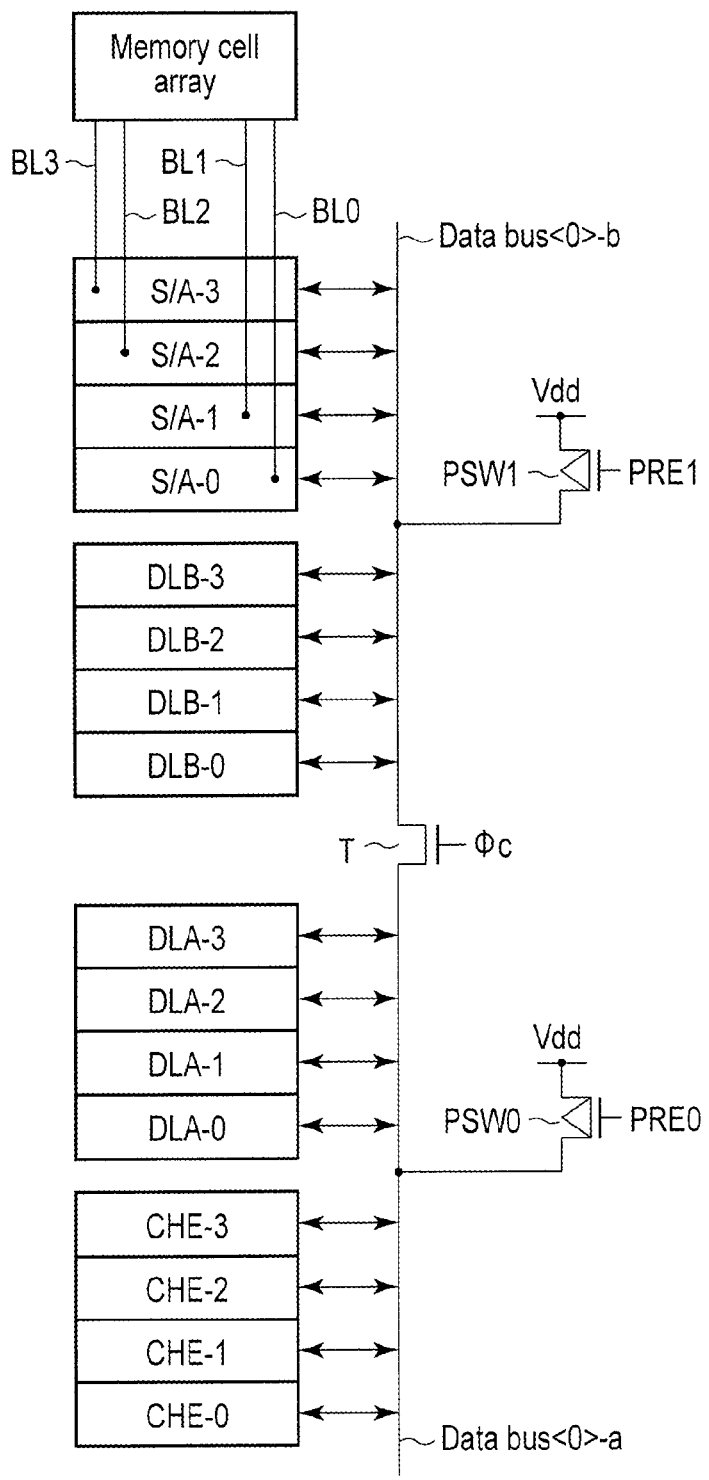
F I G. 16

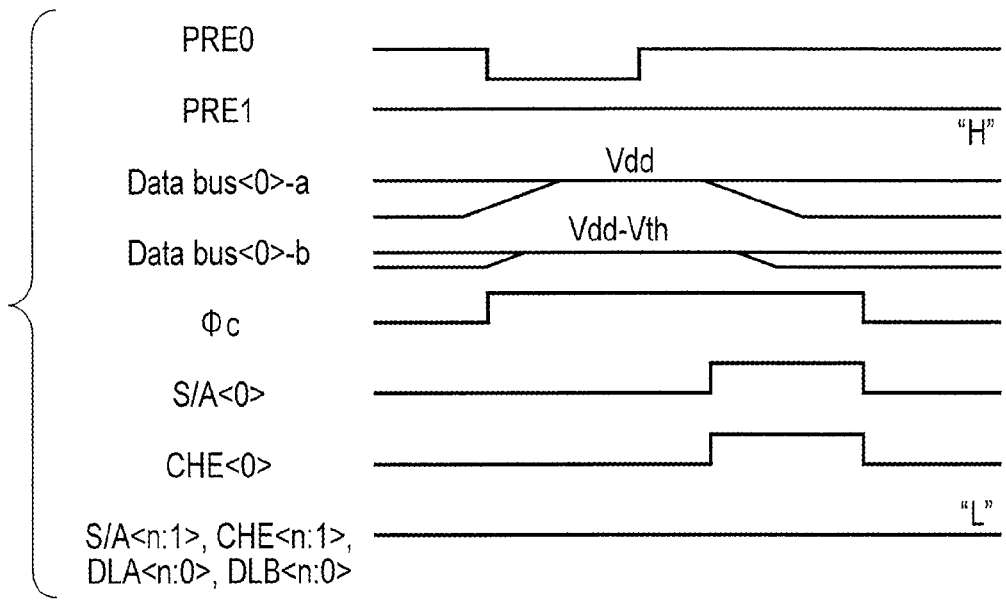
F I G. 19
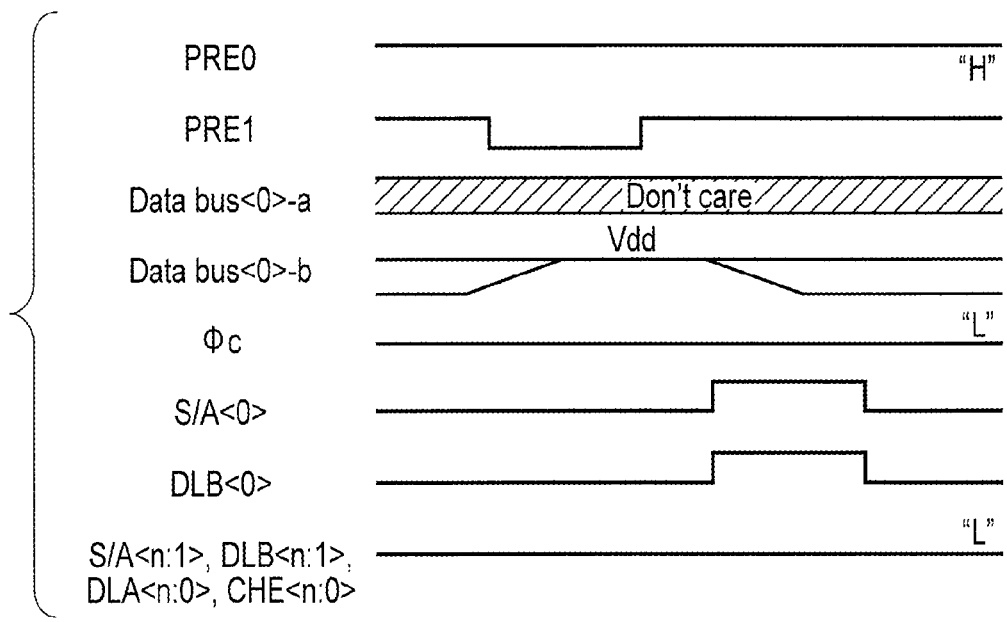
F I G. 20

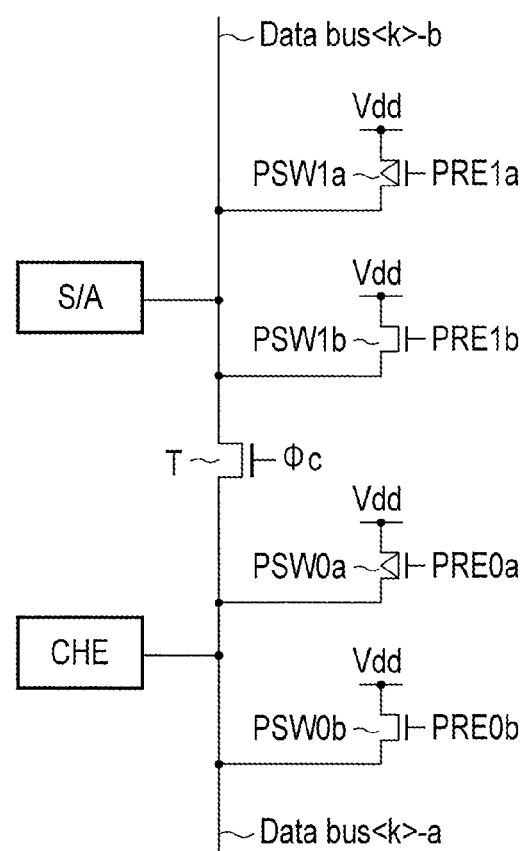
F I G. 21

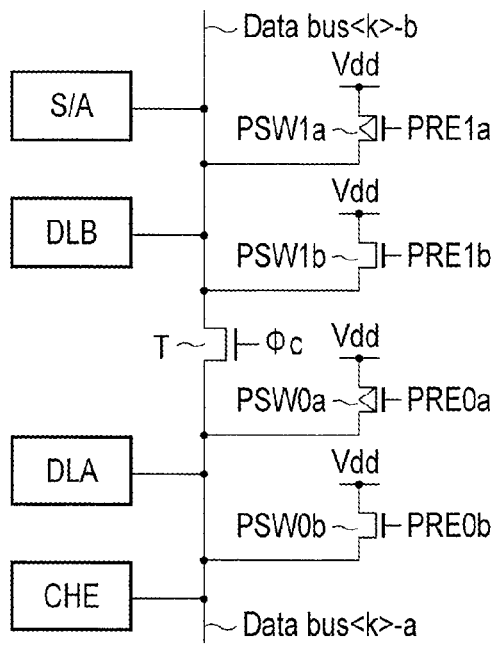
F I G. 22
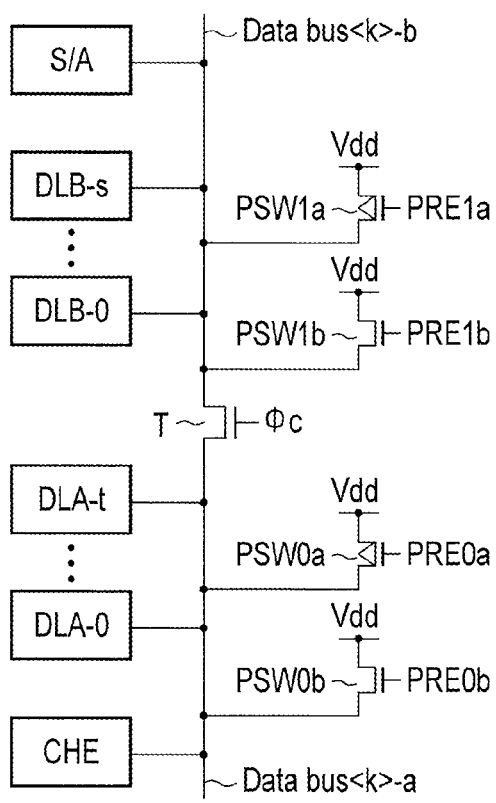
F I G. 23

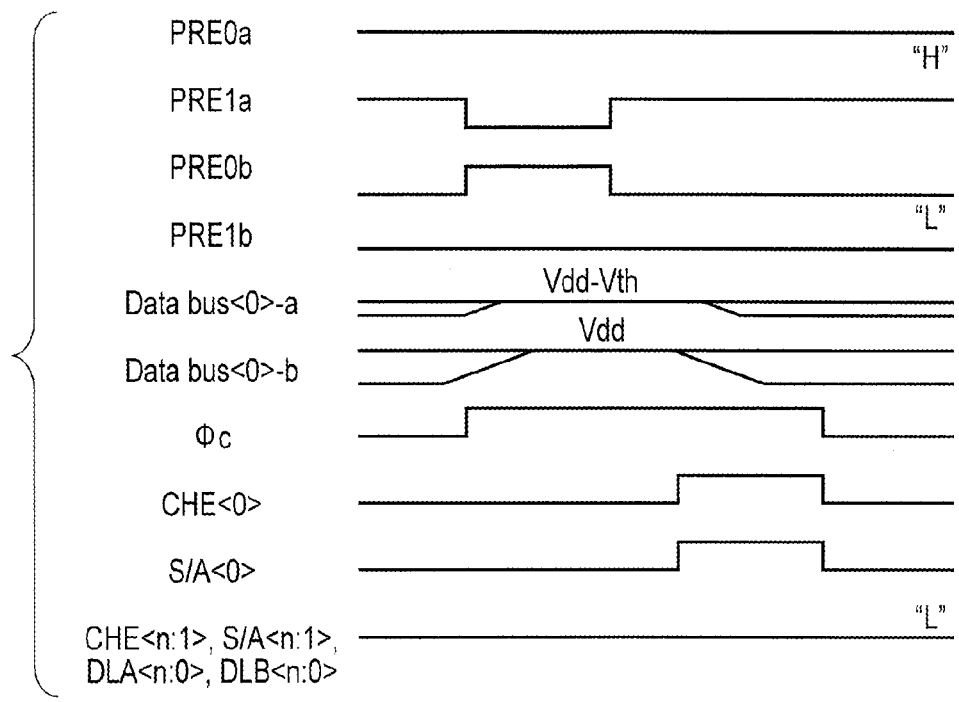
F I G. 27
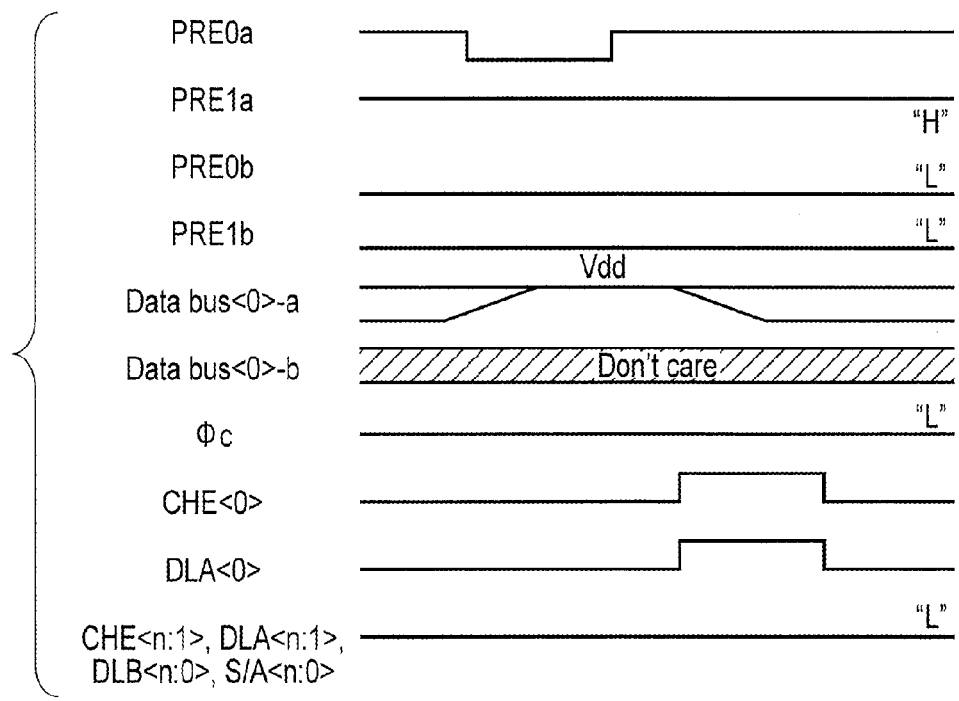
F I G. 28

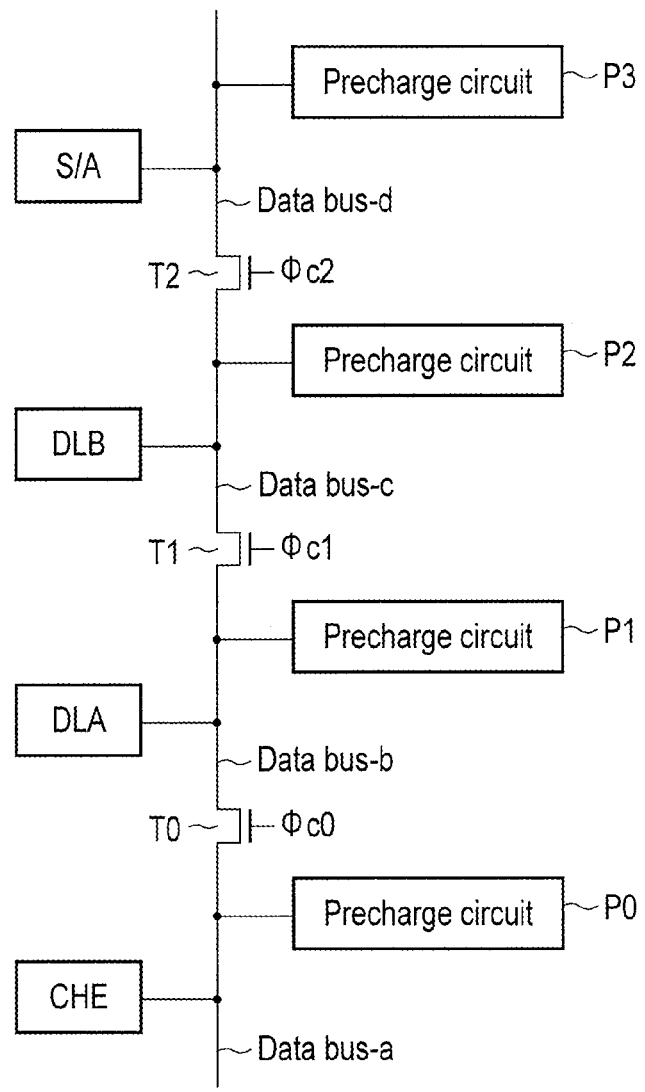
F I G. 31

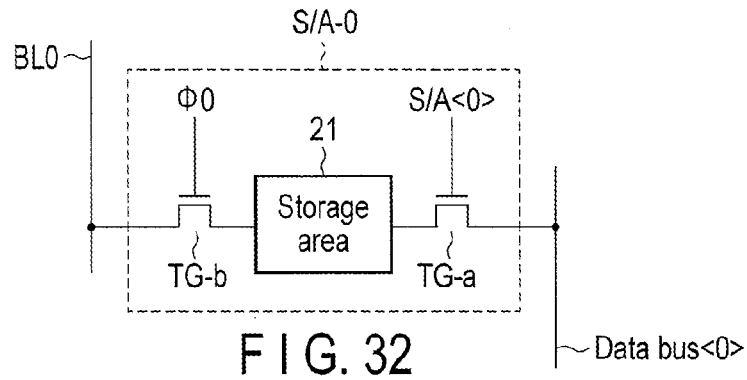
F I G. 32
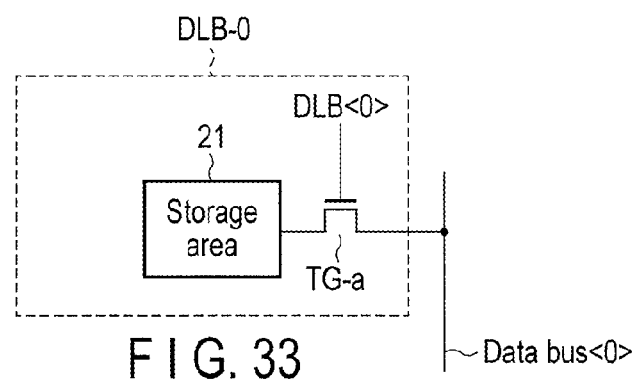
F I G. 33
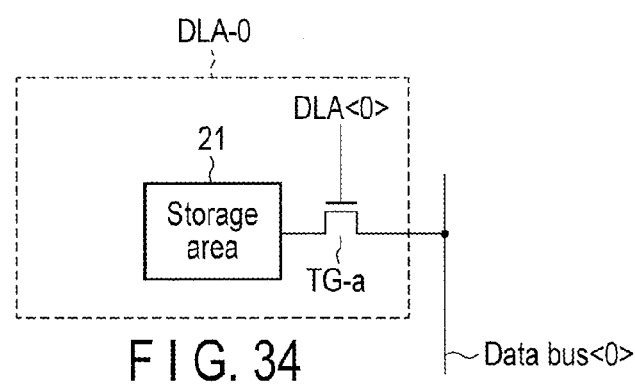
F I G. 34
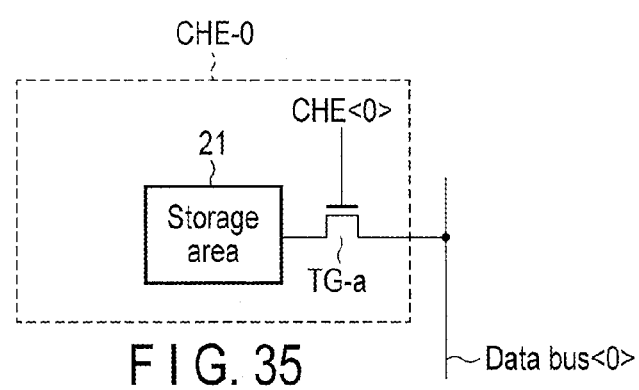
F I G. 35

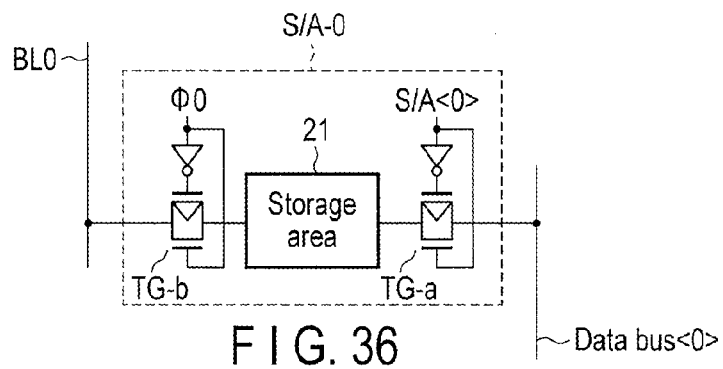
F I G. 36
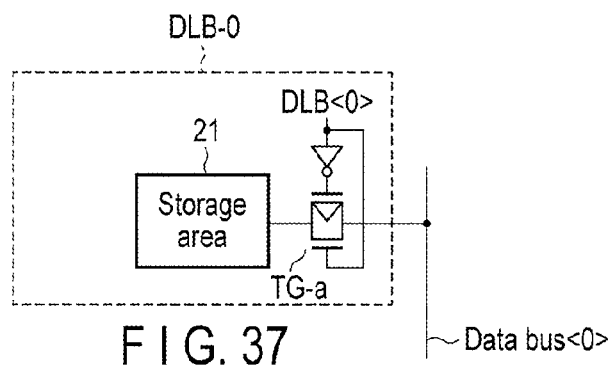
F I G. 37
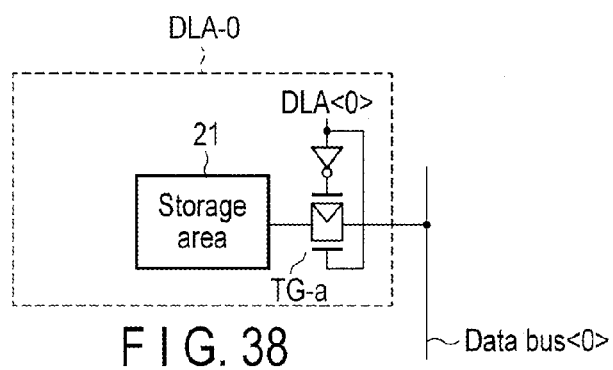
F I G. 38
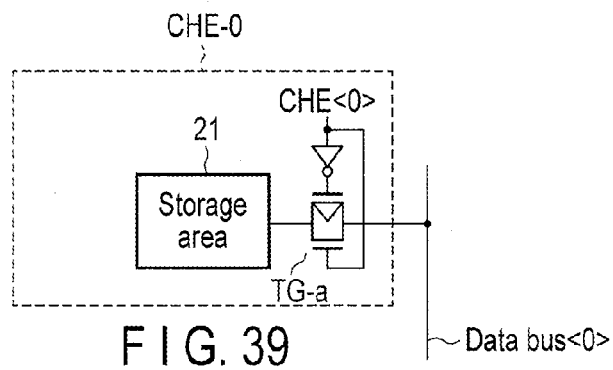
F I G. 39

NONVOLATILE SEMICONDUCTOR MEMORY

CROSS-REFERENCE TO RELATED APPLICATIONS

This application claims the benefit of U.S. Provisional Application No. 61/738,948, filed Dec. 18, 2012, the entire contents of which are incorporated herein by reference.

FIELD

Embodiments described herein relate generally to a nonvolatile semiconductor memory.

BACKGROUND

In a nonvolatile semiconductor memory, for example, a NAND flash memory, data transfer between a sense amplifier and a cache memory is performed while reading/writing. The data transfer is performed by, for example, the bus precharge method by which charging/discharging of a data bus commonly connected to the sense amplifier and the cache memory is used. This method is excellent in that the circuit area needed for data transfer can be reduced.

However, the bus precharge method is inefficient from the viewpoint of reducing power consumption because charging/discharging of the data bus is repeated.

In a multi-valued memory in which 2 bits or more are made to be stored in a memory cell, it is necessary to commonly connect data latches, in addition to the sense amplifier and the cache memory, to the data bus to perform data transfer therebetween. In this case, the data bus becomes longer, increasing the parasitic capacitance of the data bus. Moreover, all the parasitic capacitance of the data bus needs to be charged regardless of the position of the output side/input side of data.

BRIEF DESCRIPTION OF THE DRAWINGS

FIGS. 1 and 2 are each diagrams showing a nonvolatile semiconductor memory;

FIG. 11 is a diagram showing an example of the S/A & Latch area to which a data transfer according to a first embodiment is applied;

FIGS. 12 and 13 are diagrams showing an example of the S/A & Latch area to which a data transfer according to a modification of the first embodiment is applied;

FIG. 15 is a diagram showing the S/A & Latch area and the Buffer area;

FIG. 16 is a diagram showing an example of the memory connected to Data bus<0>-a and Data bus<0>-b;

FIGS. 17 to 20 are timing charts showing the data transfers according to the first embodiment and the modification thereof;

FIG. 21 is a diagram showing an example of the S/A & Latch area to which a data transfer according to a second embodiment is applied;

FIGS. 22 and 23 are diagrams showing an example of the S/A & Latch area to which a data transfer according to a modification of the second embodiment is applied;

FIGS. 27 to 30 are timing charts showing the data transfers according to the second embodiment and the modification thereof;

FIG. 31 is a diagram showing an example of the S/A & Latch area to which a data transfer according to a third embodiment is applied;

FIG. 32 is a diagram showing a modification of the sense amplifier;

FIGS. 33 and 34 are diagrams each showing modifications of the data latch;

FIG. 35 is a diagram showing a modification of the cache memory;

FIG. 36 is a diagram showing a modification of the sense amplifier;

FIGS. 37 and 38 are diagrams each showing modifications of the data latch; and

FIG. 39 is a diagram showing a modification of the cache memory.

DETAILED DESCRIPTION

In general, according to one embodiment, a nonvolatile semiconductor memory comprises: a memory cell array; a temporary storage area which temporary stores data in a read/write operation to the memory cell array; and a control circuit which controls a transfer of the data in the temporary storage area. The temporary storage area comprises: a first data bus; a second data bus; a clamp FET connected between the first data bus and the second data bus; a first precharge FET connected between the first data bus and first potential; a second precharge FET connected between the second data bus and the first potential; a first storage area connected to the first data bus; and a second storage area connected to the second data bus. The control circuit is configured to: generate a first precharge state in which the first data bus is precharged to the first potential and the second data bus is precharged to a second potential lower than the first potential, by turning the clamp FET and the first precharge FET on and turning the second precharge FET off, when the data is transferred from the second storage area to the first storage area; change the first data bus and the second data bus from the first precharge state to a first floating state by turning the first precharge FET off; output the data from the second storage area to the second data bus with the first floating state; and input the data from the first data bus with the first floating state to the first storage area.

1. COMPARATIVE EXAMPLE

Figure 2:
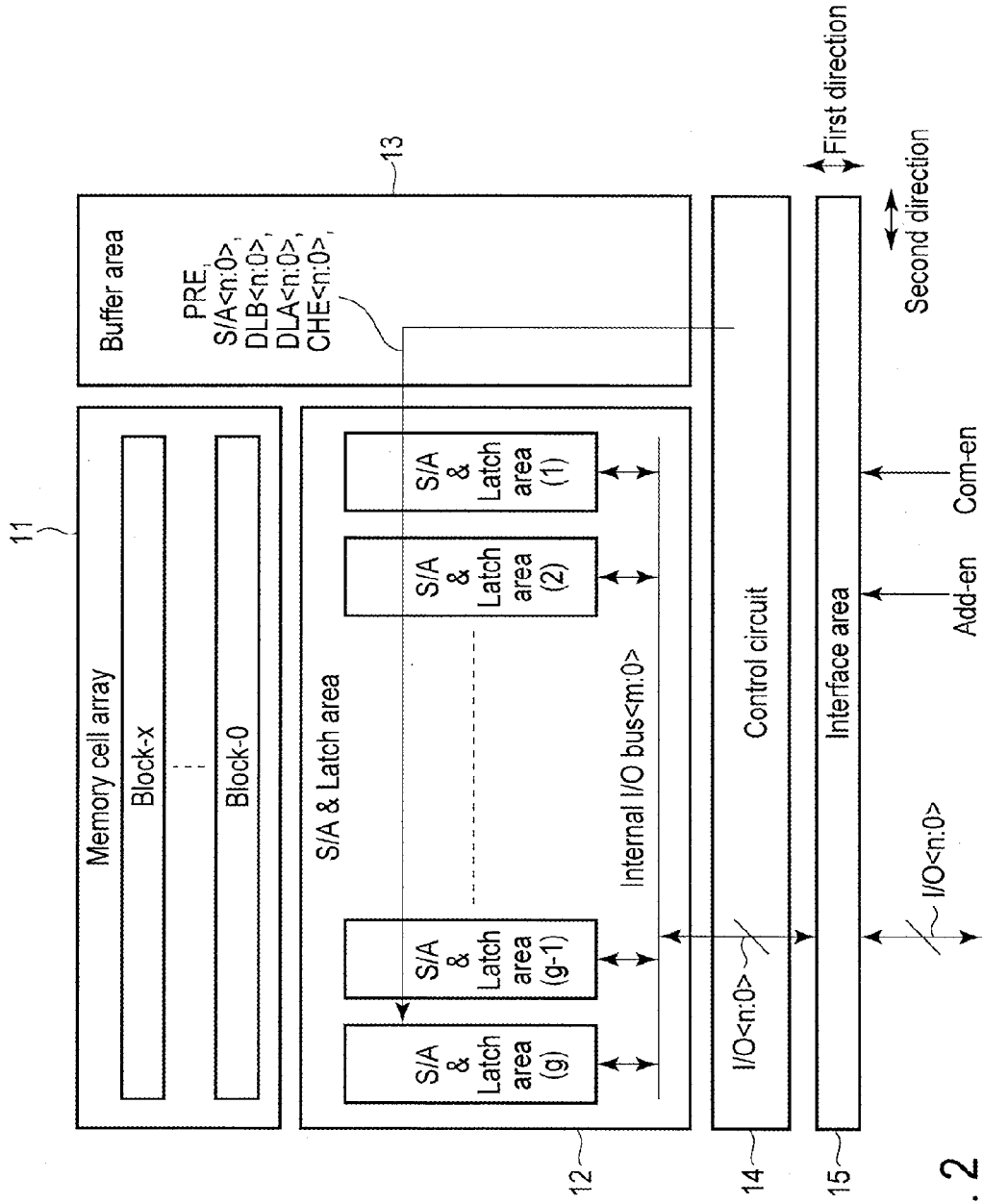

FIGS. 1 and 2 show a nonvolatile semiconductor memory.
Memory cell array 11 contains memory cells capable of storing 1 bit (binary) or 2 or more bits (multi-valued).

Memory cell array 11 includes, for example, (x+1) (x is a natural number equal to or more than 2) blocks Block-0, ... Block-x. Each of these blocks Block-0, ... Block-x includes, for example, memory cells (NAND string) connected in series.

S/A & Latch area 12 is arranged at one end of memory cell array 11 in a first direction. S/A & Latch area 12 includes, for example, g (g is a natural number equal to or more than 2) S/A & Latch areas (1), (2), ... arrayed in a second direction. These S/A & Latch areas (1), (2), ... are commonly connected to Internal I/O bus <m:0>.

Buffer area(s) 13 is (are) arranged at both ends or at one end of S/A & Latch area 12 in the second direction. In the example shown in FIG. 1, Buffer areas 13 are arranged at both ends of S/A & Latch area 12 in the second direction and in the example shown in FIG. 2 Buffer area 13 is arranged at one end of S/A & Latch area 12 in the second direction.

Control circuit 14 generates a control signal needed for data transfer by the bus precharge method. The control signal is supplied to S/A & Latch areas (1), (2), ... via Buffer area(s) 13. In the present example, the control signal contains PRE, S/A<n:0>, DLB<n:0>, DLA<n:0>, and CHE<n:0>.

Interface area 15 is an interface between an inside and an outside of a nonvolatile semiconductor memory. For example, data I/O<n:0> is input/output via Interface area 15. The data I/O<n:0> also moves between S/A & Latch areas (1), (2), ... and Interface area 15 via Internal I/O bus <m:0>.

When an address enable signal Add-en is, for example, "H(High)" (=ON), I/O<n:0> is regarded as an address and the address is input into the nonvolatile semiconductor memory. When a command enable signal Com-en is "H" (=ON), I/O<n:0> is regarded as a command and the command is input into the nonvolatile semiconductor memory.

<n:0> and <m:0> mean (n+1)-bit and (m+1)-bit data respectively n and m are each natural numbers.

Figure 3:
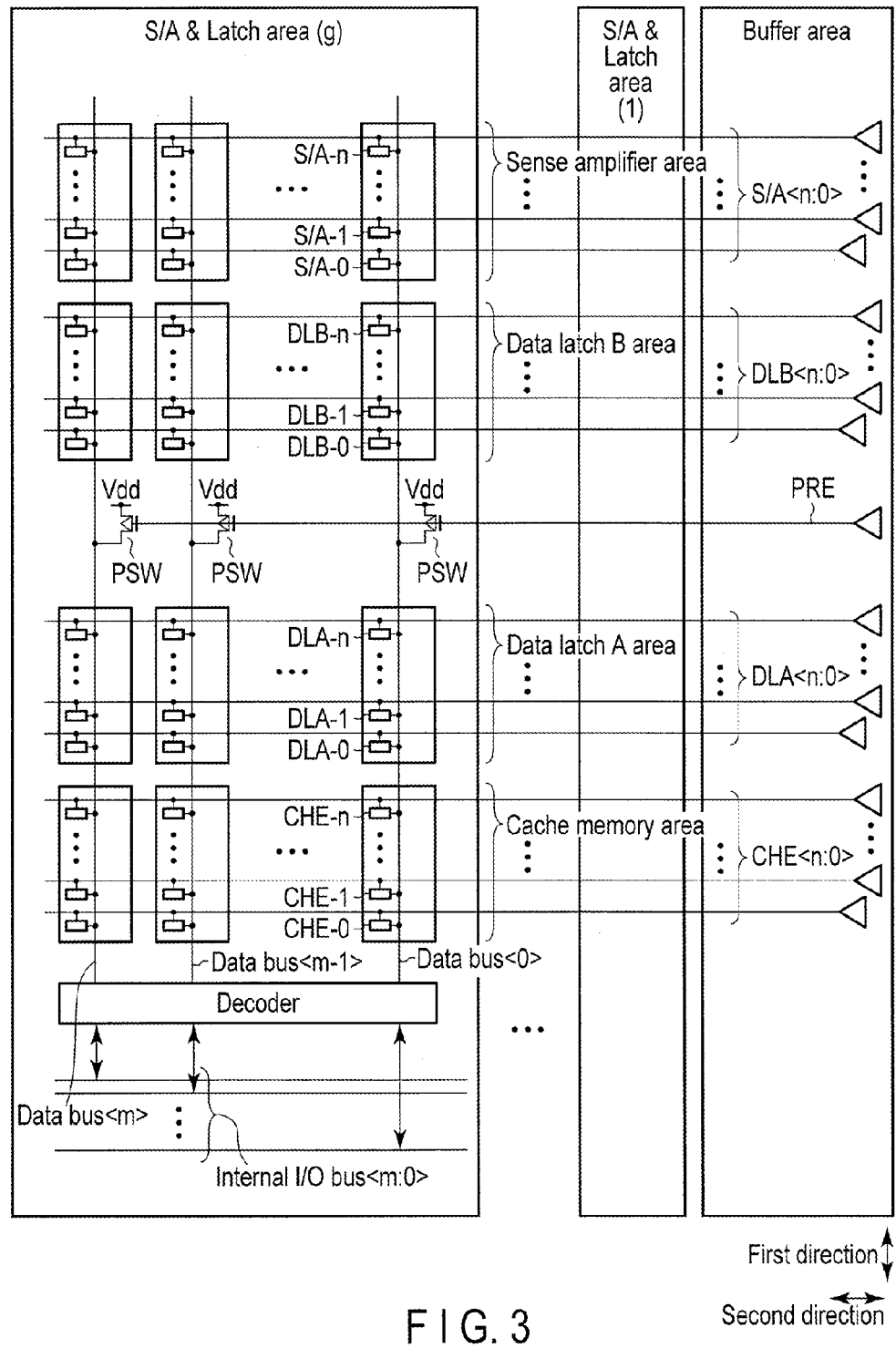
FIG. 3 is a diagram showing an S/A & Latch area and a Buffer area.

FIG. 3 is a diagram showing S/A & Latch areas (1), ... (g) and a Buffer area.

S/A & Latch areas (1), ... (g) have mutually the same circuit configuration.

The following description will be provided by taking, for example, S/A & Latch area (g) as an example.

S/A & Latch area (g) includes a Sense amplifier area, Data latch B area, Data latch A area, and Cache memory area. The number of these areas changes depending on the number of bits made to be stored in one memory cell. When, for example, 2 bits are made to be stored in one memory cell, as shown in FIG. four areas, that is, the Sense amplifier area, Data latch B area, Data latch A area, and Cache memory area are provided in S/A & Latch area (g).

S/A & Latch area (g) includes Data buses<m:0> connected to respective Internal I/O buses<m:0>. Precharge switch PSW is connected to each of Data buses<m:0>. Precharge switch PSW is, for example, a P channel type PET (Field Effect Transistor) and supplies power supply potential Vdd to Data buses<m:0> as a precharge potential based on control signal PRE.

An example of the Sense amplifier area, Data latch B area, Data latch A area, and Cache memory area connected to each of Data buses<m:0> will be described.

For example, Data bus<0> is taken as an example.

(n+1) sense amplifiers S/A-0, ... S/A-n in the Sense amplifier area are commonly connected to Data bus<0>. Sense amplifiers S/A-0, ... S/A-n only need to have functions to temporarily hold and amplify data and the circuit configuration thereof is not specifically limited. Electrical connection of amplifiers S/A-0, ... S/A-n to Data bus<0> is controlled by respective control signals S/A<n:0> from the Buffer area.

(n+1) data latches DLB-0, ... DLB-n in the Data latch B area are commonly connected to Data bus<0>. Data latches DLB-0, ... DLB-n only need to have a function to temporarily hold data and the circuit configuration thereof is not specifically limited. Electrical connection of data latches DLB-0, ... DLB-n to Data bus<0> is controlled by respective control signals DLB<n:0> from the Buffer area.

(n+1) data latches DLA-0, ... DLA-n in the Data latch A area are commonly connected to Data bus<0>. Data latches DLA-0, ... DLA-n only need to have a function to temporarily hold data and the circuit configuration thereof is not specifically limited. Electrical connection of data latches DLA-0, ... DLA-n to Data bus<0> is controlled by respective control signals DLA<n:0> from the Buffer area.

(n+1) cache memories CHE-0, ... CHE-n in the Cache memory area are commonly connected to Data bus<0>. Cache memories CHE-0, ... CHE-n only need to have a function to temporarily hold data and the circuit configuration thereof is not specifically limited. Electrical connection of cache memories CHE-0, ... CHE-n to Data bus<0> is controlled by respective control signals CHE<n:0> from the Buffer area.

Figure 4:
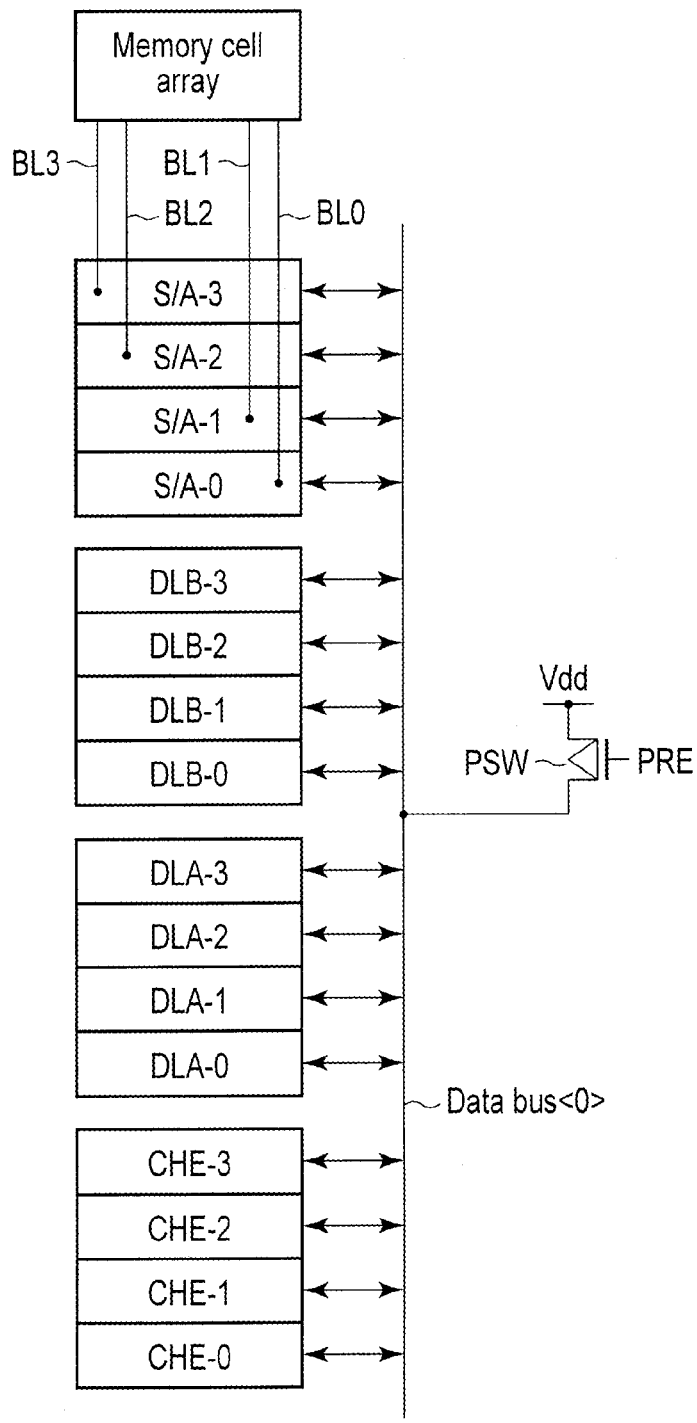
FIG. 4 is a diagram showing an example of a memory connected to Data bus<0>.

FIG. 4 shows an example of a memory connected to Data bus<0>.

The present example corresponds to n=3 in FIG. 3.

Sense amplifiers S/A-0, ... S/A-3 are connected to memory cells in the memory cell array via bit lines BL0, ... BL3 respectively.

When control signal PRE is "L(low)", P channel type precharge switch PSW is turned on and Data bus<0> is precharged to power supply potential Vdd. When control signal PRE changes from "L (low)" to "H(high)", P channel type precharge switch PSW is turned off and Data bus<0> is changed to a floating state at the precharge potential (power supply potential Vdd).

Figure 5:
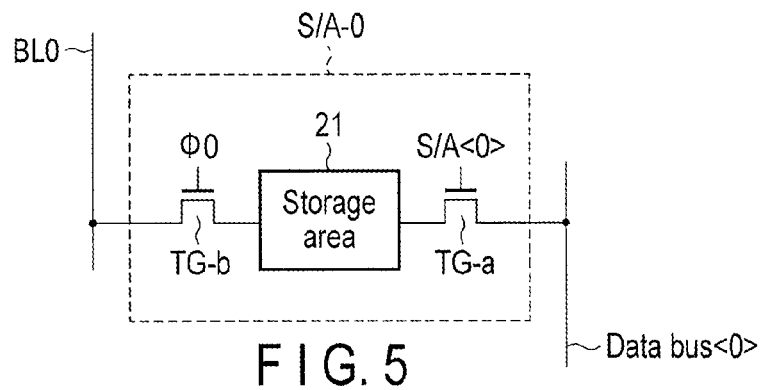
FIG. 5 is a diagram showing an example of a sense amplifier.

FIG. 5 shows an example of the sense amplifier.

For example, sense amplifier S/A-0 in FIG. 4 is taken as an example for the description that follows.

Sense amplifier S/A-0 includes, for example, Storage area 21, transfer transistor (for example, an N channel type FET) TG-a between Data bus<0> and Storage area 21, and transfer transistor (for example, an N channel type FET) TG-b between bit line BL0 and Storage area 21.

On/Off of transfer transistor TG-a is controlled by control signal S/A<0> and On/Off of transfer transistor TG-b is controlled by control signal φ0.

Storage area 21 may be a static latch circuit like a flip-flop or a dynamic latch circuit like a capacitor.

Figure 6:
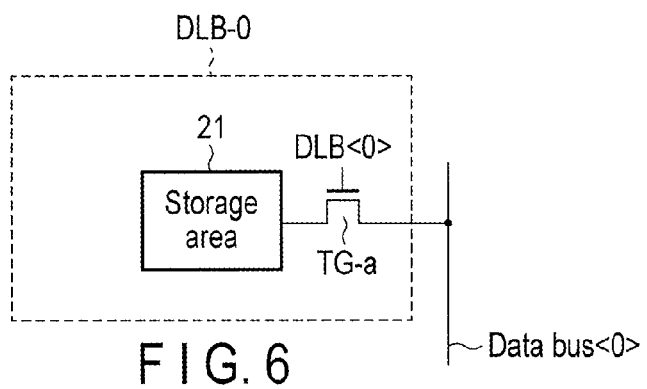
FIGS. 6 and 7 are diagrams showing an example of a data latch.

FIG. 6 shows an example of Data latch B.

For example, data latch DLB-0 in FIG. 4 is taken as an example for the description that follows.

Data latch DLB-0 includes, for example, Storage area 21 and transfer transistor (for example, an N channel type FET) TG-a between Data bus<0> and Storage area 21. On/Off of transfer transistor TG-a is controlled by control signal DLB<0>.

Storage area 21 may be a static latch circuit like a flip-flop or a dynamic latch circuit like a capacitor.

Figure 7:
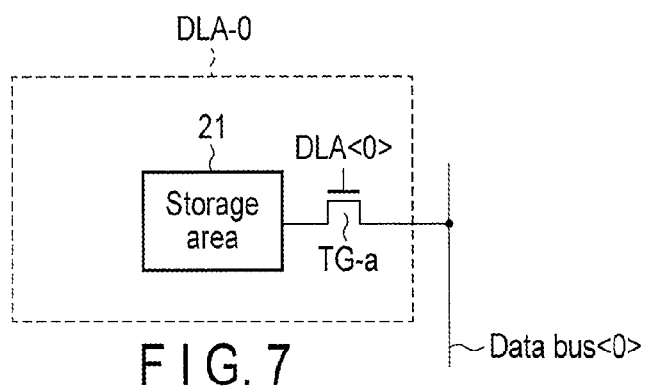

FIG. 7 shows an example of Data latch A.

For example, data latch DLA-0 in FIG. 4 is taken as an example for the description that follows.

Data latch DLA-0 includes, for example, Storage area 21 and transfer transistor (for example, an N channel type FET) TG-a between Data bus<0> and Storage area 21. On/Off of transfer transistor TG-a is controlled by control signal DLA<0>.

Storage area 21 may be a static latch circuit like a flip-flop or a dynamic latch circuit like a capacitor.

Figure 8:
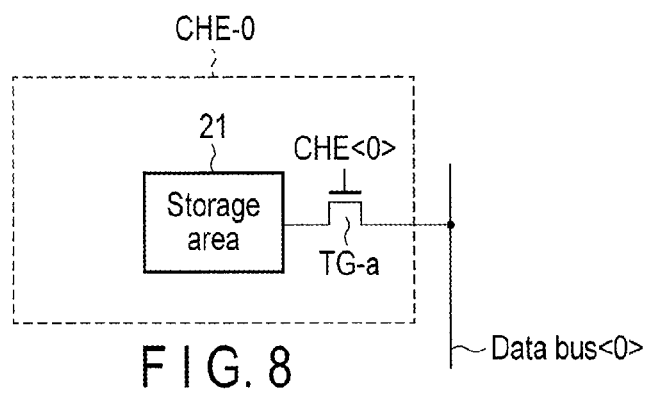
FIG. 8 is a diagram showing an example of a cache memory.

FIG. 8 shows an example of the cache memory.

For example, cache memory CHE-0 in FIG. 4 is taken as an example for the description that follows.

Cache memory CHE-0 includes, for example, Storage area 21 and transfer transistor (for example, an N channel type FET) TG-a between Data bus<0> and Storage area 21. On/Off of transfer transistor TG-a is controlled by control signal CHE<0>.

Storage area 21 may be a static latch circuit like a flip-flop or a dynamic latch circuit like a capacitor.

Figure 9:
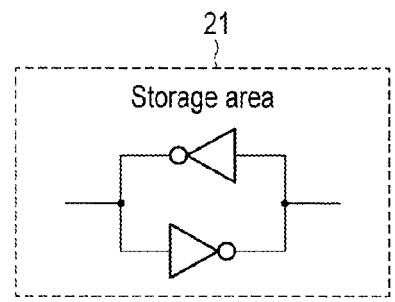
FIG. 9 is a diagram showing an example of a Storage area.

FIG. 9 shows an example of the Storage area.

In the present example, Storage area 21 is a static latch circuit including two flip-flop connected inverters.

Figure 10:
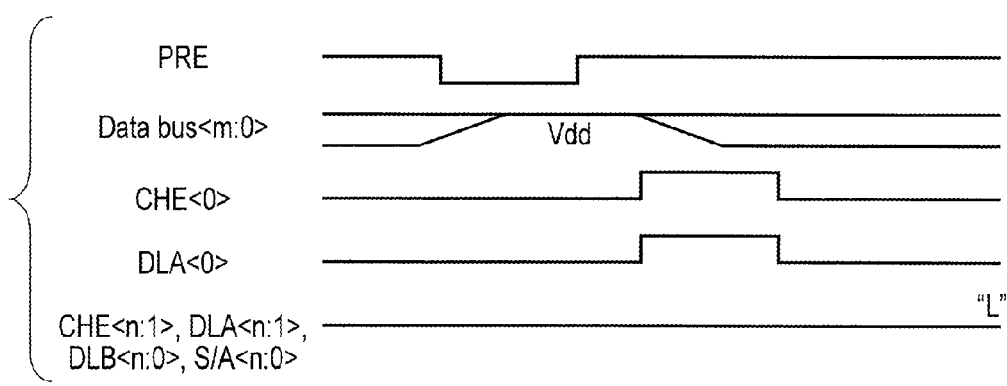
FIG. 10 is a timing chart showing a data transfer as a comparative example.

FIG. 10 shows a comparative example of the data transfer by the bus precharge method.

An example of transferring data from cache memory CHE-0 to data latch DLA-0 in S/A & Latch area (g) will be described.

First, the precharge transistor is turned on by setting control signal PRE to "L" to precharge Data buses<m:0> to power supply potential Vdd ("H").

Next, the transfer transistor in cache memory CHE-0 as an output side (sending side) of data is turned on by setting control signal CHE<0> to "H" to electrically connect cache memory CHE-0 to Data buses<m:0>. As a result, data in cache memory CHE-0 is transferred to Data buses<m:0>.

When, for example, data latched in cache memory CHE-0 is "H" (corresponding to, for example, "1"), Data buses<m:0> maintain power supply potential Vdd ("H"). When data latched in cache memory CHE-0 is "L" (corresponding to, for example, "0"), by contrast, Data buses<m:0> are discharged and change from power supply potential Vdd ("H") to ground potential Vss ("L").

Next, the transfer transistor in data latch DLA-0 as an input side (receiving side) of data is turned on by setting control signal DLA<0> to "H" to electrically connect data latch DLA-0 to Data buses<m:0>. As a result, the data transferred from cache memory CHE-0 to Data buses<m:0> is further transferred to data latch DLA-0.

When, for example, Data buses<m:0> maintain power supply potential Vdd ("H"), "H" (corresponding to, for example, "1") is transferred to data latch DLA-0. When Data buses<m:0> change to ground potential Vss ("L"), "L" (corresponding to, for example, "0") is transferred to data latch DLA-0.

In the above operation, cache memories, data latches, and sense amplifiers excluding cache memory CHE-0 as the output side (sending side) of data and data latch DLA-0 as the input side (receiving side) of data are not electrically connected to Data buses<m:0>. That is, control signals CHE<n:1>, DLA<n:1>, DLB<n:0>, S/A<n:0> always maintain "L".

The same operation as the above operation is also performed by changing the cache memory as the output side of data and the data latch as the input side of data.

When, for example, as shown in FIG. 3, the Cache memory area includes (n+1) cache memories and Data latch A area includes (n+1) data latches, the same operation as the above operation is performed n times by successively setting one of control signals CHE<n:0> and one of control signals DLA<n:0> to "H" to perform the data transfer from cache memories CHE-0, . . . CHE-n to data latches DLA-0, . . . DLA-n.

While control signal DLA<0> is set to "H" after control signal CHE<0> being set to "H" in the above operation, as shown in a waveform chart in FIG. 10, both may be set to "H" in the same timing. However, the state of data latch DLA-0 on the input side of data is undefined and thus, it is desirable to connect data latch DLA-0 on the input side of data to Data buses<m:0> after cache memory CHE-0 on the output side of data being connected to Data buses<m:0>.

In the data transfer as a comparative example described above, even if data is transferred from the Cache memory area to the Data latch A area adjacent to each other, parasitic capacitances arising in all Data buses<m:0> extending to the Data latch B area and Sense amplifier area by precharge switch PSW need to be charged.

2. Embodiment

In an embodiment described below, for example, one data bus is divided into two data buses in a nonvolatile semiconductor memory adopting the data transfer of the bus precharge method and a clamp transistor is connected between these two data buses. Accordingly, the parasitic capacitance arising in each data bus is reduced and the time needed for a precharge is shortened and also power consumption during data transfer is reduced.

However, power consumption cannot be reduced by simply connecting a clamp transistor between two data buses because if the clamp transistor is present between the output side (sending side) of data and the input side (receiving side) of data, two data buses need to be charged to precharge potential Vpre (for example, power supply potential Vdd) after all.

Thus, in an embodiment described below, control technology to change the precharge method of the data bus depending on the positions of the output side and the input side of data is proposed.

When, for example, no clamp transistor is present between the output side and the input side of data, lower power consumption is attempted to achieve by charging only one short data bus as a data transfer path. When a clamp transistor is present between the output side and the input side of data, the data bus on the input side of data is charged up to precharge potential Vpre and the data bus on the output side is charged up to (Vpre-Vth). That is, lower power consumption is attempted to achieve by reducing the amount of charge of the data bus on the output side of data. Vth is the threshold of the clamp transistor.

In the latter case, the data bus on the input side of data is in a waiting state (floating state) for quite a long time and thus, there is a possibility that erroneous data is transferred to the input side of data due to a leak arising in the data bus when charged up to (Vpre-Vth). Thus, as described above, the data bus on the input side of data is charged up to Vpre. In contrast, the data bus on the output side of data may be charged, as described above, up to (Vpre-Vth) because the data bus is immediately determined to be "H" or "L" by a sense amplifier or data latch outputting data.

Incidentally, the division number may be any number equal to or more than 2 and is not limited to 2.

(1) First Embodiment

FIG. 11 shows a first embodiment. The present example relates to movement of data between a cache memory CHE and a sense amplifier S/A.

Clamp transistor T is connected between Data bus<k>-a and Data bus<k>-b. Clamp transistor T is, for example, an N channel type FET and controls connection/disconnection between Data bus<k>-a and Data bus<k>-b. When, for example, control signal φc is "H(High)", clamp transistor T is turned on and Data bus<k>-a and Data bus<k>-b are electrically connected. When control signal φc is "L (Low)", clamp transistor T is turned off and Data bus<k>-a and Data bus<k>-b are electrically disconnected.

Cache memory CHE is connected to Data bus<k>-a and sense amplifier S/A is connected to Data bus<k>-b.

Precharge switch PSW0 is connected to Data bus<k>-a to supply power supply potential Vdd to Data bus<k>-a during precharging. If, for example, precharge switch PSW0 is a P channel type FET, precharge switch PSW0 is turned on by control signal PRE0 being changed to "L". Therefore, power supply potential Vdd is transferred to Data bus<k>-a via precharge switch PSW0.

Also, precharge switch PSW1 is connected to Data bus<k>-b to supply power supply potential Vdd to Data bus<k>-b during precharging. If, for example, precharge switch PSW1 is a P channel type FET, precharge switch PSW1 is turned on by control signal PRE1 being changed to "L". Therefore, power supply potential Vdd is transferred to Data bus<k>-b via precharge switch PSW1.

Features of operation in the first embodiment are as described below.

When data is transferred from cache memory CHE to sense amplifier S/A, Data bus<k>-b as the input side (receiving side) of data is precharged up to power supply potential Vdd. That is, control signal PRE1 is set to "L" to turn precharge switch PSW1 on.

Also, control signal φc is set to "H" to turn clamp transistor T on.

Further, control signal PRE0 is set to "H" to turn precharge switch PSW0 connected to Data bus<k>-a as the output side (sending side) of data off. That is, Data bus<k>-a as the output side of data is precharged via precharge switch PSW1 and clamp transistor T.

In this case, Data bus<k>-a as the output side of data is precharged up to a value lower than power supply potential Vdd, that is, up to (Vdd-Vth). Vth is the threshold of clamp transistor T. However, as described above, Data bus<k>-a as the output side of data is immediately determined to be "H" or "L" by data output from cache memory CHE, causing no problem in data transfer.

Therefore, when data is transferred from cache memory CHE to sense amplifier S/A, lower power consumption can be attempted to achieve by reducing the amount of charge of Data bus<k>-a as the output side of data.

Similarly, when data is transferred from sense amplifier S/A to cache memory CHE, Data bus<k>-a as the input side (receiving side) of data is precharged up to power supply potential Vdd. That is, control signal PRE0 is set to "L" to turn precharge switch PSW0 on.

Also, control signal φc is set to "H" to turn clamp transistor T on.

Further, control signal PRE1 is set to "H" to turn precharge switch PSW1 connected to Data bus<k>-b as the output side (sending side) of data off. That is, Data bus<k>-b as the output side of data is precharged via precharge switch PSW0 and clamp transistor T.

In this case, Data bus<k>-b as the output side of data is precharged up to a value lower than power supply potential Vdd, that is, up to (Vdd-Vth). Vth is the threshold of clamp transistor T. However, as described above, Data bus<k>-b as the output side of data is immediately determined to be "H" or "L" by data output from sense amplifier S/A, causing no problem in data transfer.

Therefore, when data is transferred from sense amplifier S/A to cache memory CHE, lower power consumption can be attempted to achieve by reducing the amount of charge of Data bus<k>-b as the output side of data.

FIG. 12 shows a modification of the first embodiment.

When compared with the first embodiment, the modification is characterized in that data latch DLA is connected to Data bus<k>-a and data latch DLB is connected to Data bus<k>-b. Otherwise, the modification is the same as the first embodiment. Therefore, the same reference numerals are attached to the same elements in FIG. 12 as those in FIG. 11 to omit a detailed description thereof.

In the present example, cache memory CHE and data latch DLA are connected to Data bus<k>-a and data latch DLB and sense amplifier S/A are connected to Data bus<k>-b. Therefore, 12 combinations can be formed by selecting two memories from four memories via Data bus<k>-a/Data bus<k>-b.

Data Transfer Between Cache Memory CHF and Data Latch DLA (Two Combinations)

In this case, Data bus<k>-a as the output side (sending side) or the input side (receiving side) of data is precharged up to power supply potential Vdd. That is, control signal PRE0 is set to "L" to turn precharge switch PSW0 on.

Also, control signal (φc is set to "L" to turn clamp transistor T off.

Further, control signal PRE1 is set to "H" to turn precharge switch PSW1 connected to Data bus<k>-b independent of data transfer off.

Thus, when data transfer is performed between cache memory CHE and data latch DLA, that is, clamp transistor T is not present between the output side and the input side of data, lower power consumption can be achieved by charging only one short Data bus<k>-a used for data transfer.

Data Transfer Between Data Latch DLB and Sense Amplifier S/A (Two Combinations)

In this case, Data bus<k>-b as the output side (sending side) or the input side (receiving side) of data is precharged up to power supply potential Vdd. That is, control signal PRE1 is set to "L" to turn precharge switch PSW1 on.

Also, control signal (φc is set to "L" to turn clamp transistor T off.

Further, control signal PRE0 is set to "H" to turn precharge switch PSW0 connected to Data bus<k>-a independent of data transfer off.

Thus, when data transfer is performed between data latch DLB and sense amplifier S/A, that is, clamp transistor T is not present between the output side and the input side of data, lower power consumption can be achieved by charging only one short Data bus<k>-b used for data transfer.

Data Transfer (Two Combinations) from Cache Memory CHE to Data Latch DLB or Sense Amplifier S/A and Data Transfer (Two Combinations) from Data Latch DLA to Data Latch DLB or Sense Amplifier S/A In these data transfers, Data bus<k>-b as the input side (receiving side) of data is precharged up to power supply potential Vdd. That is, control signal PRE1 is set to "L" to turn precharge switch PSW1 on.

Also, control signal φc is set to "H" to turn clamp transistor T on.

Further, control signal PRE0 is set to "H" to turn precharge switch PSW0 connected to Data bus<k>-a as the output side (sending side) of data off. That is, Data bus<k>-a as the output side of data is precharged via precharge switch PSW1 and clamp transistor T.

In this case, Data bus<k>-a as the output side of data is precharged up to a value lower than power supply potential Vdd, that is, up to (Vdd-Vth). Vth is the threshold of clamp transistor T. However, Data bus<k>-a as the output side of data is immediately determined to be "H" or "L" by data output from cache memory CHE or data latch DLA, causing no problem in data transfer.

Therefore, when data is transferred from cache memory CHE or data latch DLA to data latch DLB or sense amplifier S/A, lower power consumption can be attempted to achieve by reducing the amount of charge of Data bus<k>-a as the output side of data.

Data Transfer (Two Combinations) from Sense Amplifier S/A to Data Latch DLA or Cache Memory CHE and Data Transfer (Two Combinations) from Data Latch DLB to Data Latch DLA or Cache Memory CHE.

In these data transfers, Data bus<k>-a as the input side (receiving side) of data is precharged up to power supply potential Vdd. That is, control signal PRE0 is set to "L" to turn precharge switch PSW0 on.

Also, control signal φc is set to "H" to turn clamp transistor T on.

Further, control signal PRE1 is set to "H" to turn precharge switch PSW1 connected to Data bus<k>-b as the output side (sending side) of data off. That is, Data bus<k>-b as the output side of data is precharged via precharge switch PSW0 and clamp transistor T.

In this case, Data bus<k>-b as the output side of data is precharged up to a value lower than power supply potential Vdd, that is, up to (Vdd-Vth). Vth is the threshold of clamp transistor T. However, Data bus<k>-b as the output side of data is immediately determined to be "H" or "L" by data output from sense amplifier S/A or data latch DLB, causing no problem in data transfer.

Therefore, when data is transferred from sense amplifier S/A or data latch DLB to data latch DLA or cache memory CHE, lower power consumption can be attempted to achieve by reducing the amount of charge of Data bus<k>-b as the output side of data.

In the present example, the number of memories connected to Data bus<k>-a is two (cache memory CHE and data latch DLA) and the number of memories connected to Data bus<k>-b is also two (data latch DLB and sense amplifier S/A), but the present example is not limited to such an example.

For example, as shown in FIG. 13, (t+1) data latches DLA-0, . . . DLA-t may be connected to Data bus<k>-a by increasing the number of data latches connected to Data bus<k>-a or (s+1) data latches DLA-0, . . . DLA-s may be connected to Data bus<k>-b by increasing the number of data latches connected to Data bus<k>-b. t and s are both natural numbers.

In FIGS. 11 to 13, each of cache memory CHE, data latches DLA (DLA-0, . . . DLA-t), data latches DLB (DLB-0, . . . DLB-s), and sense amplifier S/A needs to contain one memory or more, but in general, more than one memory is contained.

Figure 14:
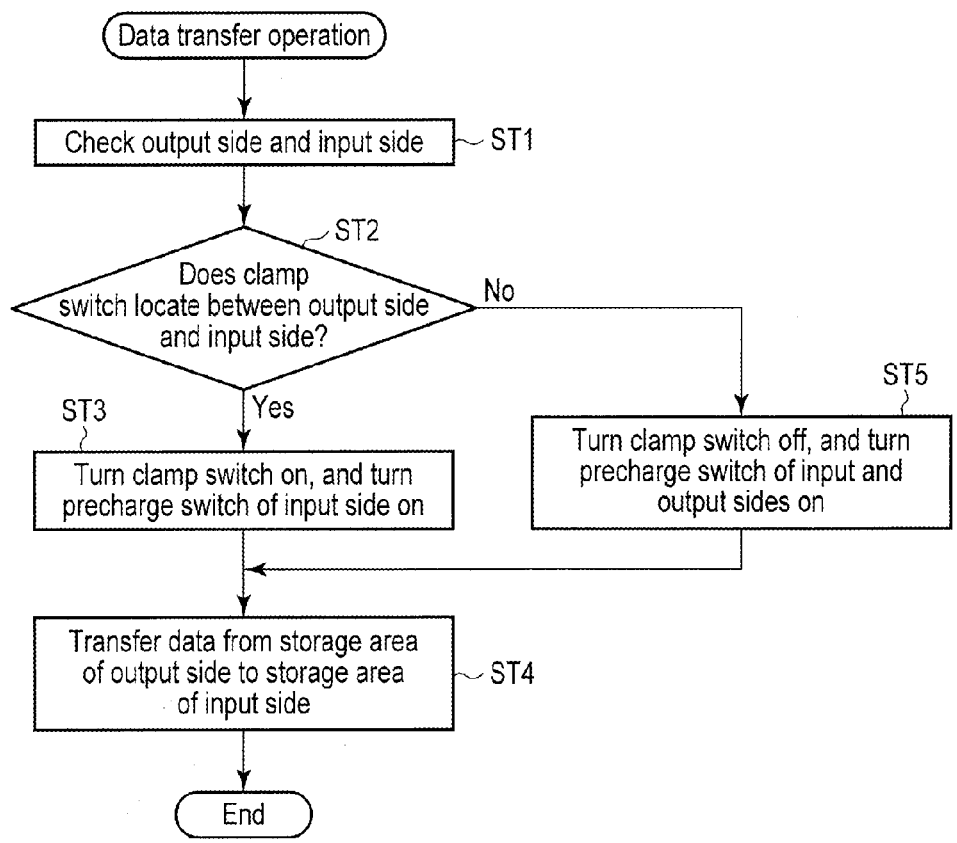
FIG. 14 is a flow chart showing the data transfers according to the first embodiment and the modification thereof.

FIG. 14 is a flow chart of a data transfer operation.

The flow chart is a generalization of the data transfer operation of the first embodiment and the modification thereof described above and is executed by, for example, control circuit 14 in FIG. 1 or FIG. 2.

First, the output side (sending side) and the input side (receiving side) of data are checked (step ST1). Also, whether a clamp switch (clamp transistor) locates between the output side and the input side of data is checked (step ST2).

If the clamp switch locates between the output side and the input side of data, the clamp switch is turned on and the precharge switch on the input side of data is turned on (step ST3). Then, data is transferred from a Storage area on the output side of data to a Storage area on the input side of data (step ST4).

If the clamp switch does not locate between the output side and the input side of data, the clamp switch is turned off and the precharge switch as the output side or the input side of data is turned on (step ST5).

Then, data is transferred from a Storage area on the output side of data to a Storage area on the input side of data (step ST4).

Next, an application example of the first embodiment and the modification thereof will be described.

Here, a case when the data transfer operation in the first embodiment and the modification thereof is applied to the nonvolatile semiconductor memory shown in FIGS. 1 and 2 will be described.

FIG. 15 shows S/A & Latch areas (1), . . . (g) and a Buffer area.

S/A & Latch areas (1), . . . (g) have mutually the same circuit configuration.

The following description will be provided by taking, for example, S/A & Latch area (g) as an example.

S/A & Latch area (g) includes a Sense amplifier area, Data latch B area, Data latch A area, and Cache memory area. The number of these areas changes depending on the number of bits made to be stored in one memory cell. When, for example, 2 bits are made to be stored in 1 memory cell, as shown in FIG. 4 areas, that is, the Sense amplifier area, Data latch B area, Data latch A area, and Cache memory area are provided in S/A & Latch area (g).

S/A & Latch area (g) includes Data buses<m:0> connected to respective Internal I/O buses<m:0>. Precharge switch PSW0 is connected to each of Data buses<m:0>-a and precharge switch PSW1 is connected to each of Data buses<m:0>-b.

Clamp transistor T is connected between Data buses<m:0>-a and Data buses<m:0>-b. Clamp transistor T is, for example, an N channel type FET and controls connection/disconnection between Data buses<m:0>-a and Data buses<m:0>-b based on control signal φc.

Precharge switches PSW0, PSW1 are each, for example, P channel types FETs. Precharge switch PSW0 supplies power supply potential Vdd to Data buses<m:0>-a as a precharge potential based on control signal PRE0 and precharge switch PSW1 supplies power supply potential Vdd to Data buses<m:0>-b as a precharge potential based on control signal PRE1.

An example of the Cache memory area and Data latch A area connected to Data buses<m:0>-a and the Sense amplifier area and Data latch B area connected to Data buses<m:0>-b will be described.

For example, Data bus<0> is taken as an example.

(n+1) sense amplifiers S/A-0, . . . S/A-n in the Sense amplifier area are commonly connected to Data bus<0>-b. Sense amplifiers S/A-0, . . . S/A-n only need to have functions to temporarily hold and amplify data and the circuit configuration thereof is not specifically limited. Electrical connection of amplifiers S/A-0, . . . S/A-n to Data bus<0>-b is controlled by respective control signals S/A<n:0> from the Buffer area.

(n+1) data latches DLB-0, . . . DLB-n in the Data latch B area are commonly connected to Data bus<0>-b. Data latches DLB-0, . . . DLB-n only need to have a function to temporarily hold data and the circuit configuration thereof is not specifically limited. Electrical connection of data latches DLB-0, . . . DLB-n to Data bus<0>-b is controlled by respective control signals DLB<n:0> from the Buffer area.

(n+1) data latches DLA-0, . . . DLA-n in the Data latch A area are commonly connected to Data bus<0>-a. Data latches DLA-0, . . . DLA-n only need to have a function to temporarily hold data and the circuit configuration thereof is not specifically limited. Electrical connection of data latches DLA-0, . . . DLA-n to Data bus<0>-a is controlled by respective control signals DLA<n:0> from the Buffer area.

(n+1) cache memories CHE-0, . . . CHE-n in the Cache memory area are commonly connected to Data bus<0>-a. Cache memories CHE-0, . . . CHE-n only need to have a function to temporarily hold data and the circuit configuration thereof is not specifically limited. Electrical connection of cache memories CHE-0, . . . CHE-n to Data bus<0>-a is controlled by respective control signals CHE<n:0> from the Buffer area.

FIG. 16 shows an example of the memory connected to Data bus<0>-a and Data bus<0>-b.

The present example corresponds to n=3 in FIG. 15.

Sense amplifiers S/A-0, . . . S/A-3 are connected to memory cells in the memory cell array via bit lines BL0, . . . BL3 respectively.

When control signal PRE0 is "L(low)", P channel type precharge switch PSW0 is turned on and Data bus<0>-a is precharged to power supply potential Vdd. When clamp transistor T is turned on and precharge switch PSW1 is turned off, Data bus<0>-b is precharged to (Vdd-Vth).

When control signal PRE0 changes from "L (low)" to "H(high)", P channel type precharge switch PSW0 is turned off. Thus, Data bus<0>-a changes to a floating state at the precharge potential (power supply potential Vdd) and Data bus<0>-b changes to a floating state at (Vdd-Vth).

When control signal PRE1 is "L(low)", P channel type precharge switch PSW1 is turned on and Data bus<0>-b is precharged to power supply potential Vdd. When clamp transistor T is turned on and precharge switch PSW0 is turned off, Data bus<0>-a is precharged to (Vdd-Vth).

When control signal PRE1 changes from "L (low)" to "H(high)", P channel type precharge switch PSW1 is turned off. Thus, Data bus<0>-b changes to a floating state at the precharge potential (power supply potential Vdd) and Data bus<0>-a changes to a floating state at (Vdd-Vth).

As an example of the sense amplifier, Data latch A, Data latch B, and cache memory, circuits shown in FIGS. 5 to 8 can be cited. As Storage area 21 shown in FIGS. 5 to 8, for example, a static latch circuit shown in FIG. 9 can be shown.

FIGS. 17 to 20 show a data transfer example of the nonvolatile semiconductor memory in FIG. 15.

Figure 17:
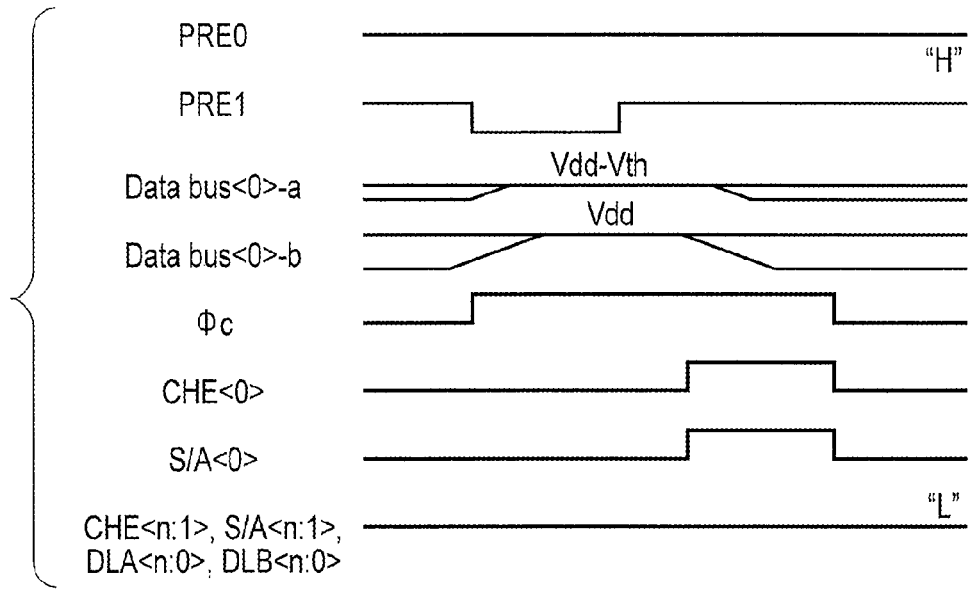

Data Transfer from Cache Memory CHE-0 to Sense Amplifier S/A-0 (FIG. 17)

First, control signal PRE1 is set to "L" and control signal φc is set to "H". Control signal PRE0 is always "H". Accordingly, Data bus<0>-b is precharged to power supply potential Vdd ("H") and Data bus<0>-a is precharged to (Vdd-Vth). Then, control signal PRE1 is set to "H" to change Data bus<0>-a and Data bus<0>-b to a floating state.

Next, the transfer transistor in cache memory CHE-0 as the output side (sending side) of data is turned on by setting control signal CHE<0> to "H" to output data in cache memory CHE-0 to Data bus<0>-a.

When, for example, data latched in cache memory CHE-0 is "H" (corresponding to, for example, "1"), Data bus<0>-a maintains (Vdd-Vth), that is, "H". At this point, Data bus<0>-b maintains power supply potential Vdd, that is, "H".

When data latched in cache memory CHE-0 is "L" (corresponding to, for example, "0"), by contrast, Data bus<0>-a is discharged to change from (Vdd-Vth) to ground potential Vss, that is, "L". At this point, Data bus<0>-b also changes from power supply potential Vdd to ground potential Vss.

Next, the transfer transistor in sense amplifier S/A-0 as the input side (receiving side) of data is turned on by setting control signal S/A<0> to "H" to electrically connect sense amplifier S/A-0 to Data bus<0>-b. As a result, data output from cache memory CHE-0 to Data bus<0>-a is further input into sense amplifier S/A-0 via Data bus<0>-b.

When, for example, Data bus<0>-b maintains power supply potential Vdd ("H"), "H" (corresponding to, for example, "1") is transferred to sense amplifier S/A-0. When Data bus<0>-b change to ground potential Vss ("L"), "L" (corresponding to, for example, "0") is transferred to sense amplifier S/A-0.

Then, control signals (φc, CHE<0>, S/A<0> are set to "L".

In the above operation, memories other than cache memory CHE-0 as the output side (sending side) of data and sense amplifier S/A-0 as the input side (receiving side) of data are not electrically connected to Data bus<0>-a and Data bus<0>-b. That is, control signals CHE<n:1>, S/A<n:1>, DLA<n:0>, DLB<n:0> always maintain "L".

The same operation as the above operation is also performed by changing the cache memory as the output side of data and the sense amplifier as the input side of data.

When, for example, as shown in FIG. 15, the Cache memory area includes (n+1) cache memories and the Sense amplifier area includes (n+1) sense amplifiers, the same operation as the above operation is performed (n+1) times by successively setting one of control signals CHE<n:0> and one of control signals S/A<n:0> to "H" to perform the data transfer from cache memories CHE-0, . . . CHE-n to sense amplifiers S/A-0, . . . S/A-n.

While control signal S/A<0> is set to "H" after control signal CHE<0> being set to "H" in the above operation, as shown in a waveform chart in FIG. 17, both may be set to "H" in the same timing. However, the state of sense amplifier S/A-0 on the input side of data is undefined and thus, it is desirable to connect sense amplifier S/A-0 on the input side of data to Data bus<0>-b after cache memory CHE-0 on the output side of data being connected to Data bus<0>-a.

Figure 18:
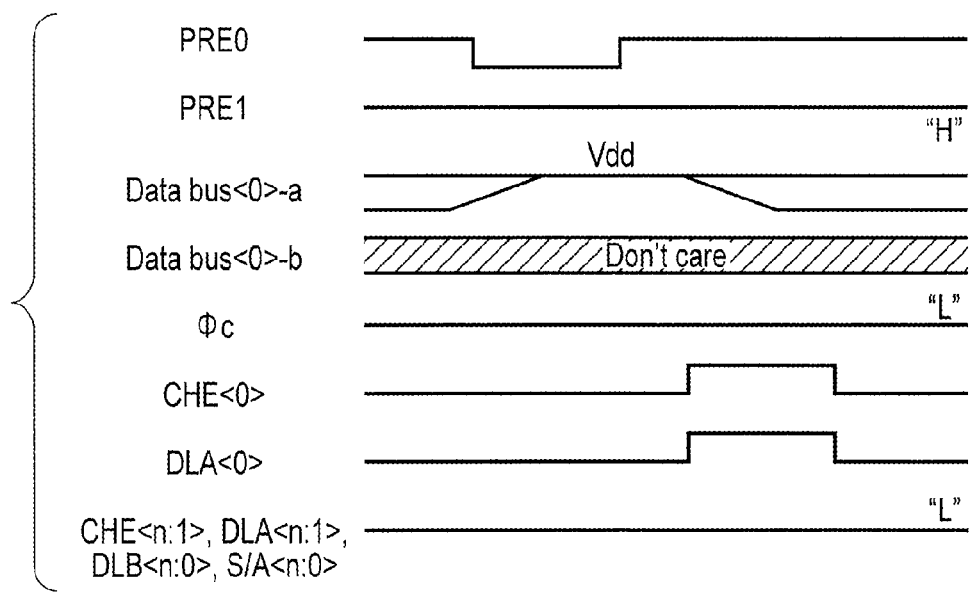

Data Transfer from Cache Memory CHE-0 to Data Latch DLA-0 (FIG. 18)

First, control signal PRE0 is set to "L" to precharge Data bus<0>-a to power supply potential Vdd ("H"). Control signal PRE1 is always "H" and control signal φc is always "L". That is, Data bus<0>-b is not used for this data transfer. Then, control signal PRE0 is set to "H" to change Data bus<0>-a to a floating state.

Next, the transfer transistor in cache memory CHE-0 as the output side (sending side) of data is turned on by setting control signal CHE<0> to "H" to output data in cache memory CHE-0 to Data bus<0>-a.

When, for example, data latched in cache memory CHE-0 is "H" (corresponding to, for example, "1"), Data bus<0>-a maintains power supply potential Vdd, that is, "H". When data latched in cache memory CHE-0 is "L" (corresponding to, for example, "0"), by contrast, Data bus<0>-a is discharged to change from power supply potential Vdd to ground potential Vss, that is, "L".

Next, the transfer transistor in data latch DLA-0 as the input side (receiving side) of data is turned on by setting control signal DLA<0> to "H" to electrically connect data latch DLA-0 to Data bus<0>-a. As a result, data is transferred from cache memory CHE-0 to data latch DLA-0 via Data bus<0>-a.

When, for example, Data bus<0>-a maintains power supply potential Vdd ("H"), "H" (corresponding to, for example, "1") is transferred to data latch DLA-0. When Data bus<0>-a changes to ground potential Vss ("L"), "L" (corresponding to, for example, "0") is transferred to data latch DLA-0.

Then, control signals CHE<0>, DLA<0> are set to "L".

In the above operation, memories other than cache memory CHE-0 as the output side (sending side) of data and data latch DLA-0 as the input side (receiving side) of data are not electrically connected to Data bus<0>-a. That is, control signals CHE<n:1>, DLA<n:1>, DLB<n:0>, S/A<n:0> always maintain "L".

The same operation as the above operation is also performed by changing the cache memory as the output side of data and the data latch as the input side of data.

When, for example, as shown in FIG. 15, the Cache memory area includes (n+1) cache memories and Data latch A area includes (n+1) data latches, the same operation as the above operation is performed (n+1) times by successively setting one of control signals CHE<n:0> and one of control signals DLA<n:0> to "H" to perform the data transfer from cache memories CHE-0, . . . CHE-n to data latches DLA-0, . . . DLA-n.

While control signal DLA<0> is set to "H" after control signal CHE<0> being set to "H" in the above operation, as shown in a waveform chart in FIG. 18, both may be set to "H" in the same timing. However, the state of data latch DLA-0 on the input side of data is undefined and thus, it is desirable to connect data latch DLA-0 on the input side of data to Data bus<0>-a after cache memory CHE-0 on the output side of data being connected to Data bus<0>-a.

Data Transfer from Sense Amplifier S/A-0 to Cache Memory CHE-0 (FIG. 19)

First, control signal PRE0 is set to "L" and control signal φc is set to "H". Control signal PRE1 is always "H". Accordingly, Data bus<0>-a is precharged to power supply potential Vdd ("H") and Data bus<0>-b is precharged to (Vdd-Vth). Then, control signal PRE0 is set to "H" to change Data bus<0>-a and Data bus<0>-b to a floating state.

Next, the transfer transistor in sense amplifier S/A-0 as the output side (sending side) of data is turned on by setting control signal S/A<0> to "H" to output data of sense amplifier S/A-0 to Data bus<0>-b.

When, for example, data latched in sense amplifier S/A-0 is "H" (corresponding to, for example, "1"), Data bus<0>-b maintains (Vdd-Vth), that is, "H". At this point, Data bus<0>-a maintains power supply potential Vdd, that is, "H".

When data latched in sense amplifier S/A-0 is "L" (corresponding to, for example, "0"), by contrast, Data bus<0>-b is discharged to change from (Vdd-Vth) to ground potential Vss, that is, "L". At this point, Data bus<0>-a also changes from power supply potential Vdd to ground potential Vss.

Next, the transfer transistor in cache memory CHE-0 as the input side (receiving side) of data is turned on by setting control signal CHE<0> to "H" to electrically connect cache memory CHE-0 to Data bus<0>-a. As a result, the data output from sense amplifier S/A-0 to Data bus<0>-b is further input into cache memory CHE-0 via Data bus<0>-a.

When, for example, Data bus<0>-a maintains power supply potential Vdd ("H"), "H" (corresponding to, for example, "1") is transferred to cache memory CHE-0. When Data bus<0>-a changes to ground potential Vss ("L"), "L" (corresponding to, for example, "0") is transferred to cache memory CHE-0.

Then, control signals φc, S/A<O>, CHE<O> are set to "L".

In the above operation, memories other than sense amplifier S/A-0 as the output side (sending side) of data and cache memory CHE-0 as the input side (receiving side) of data are not electrically connected to Data bus<0>-a and Data bus<0>-b. That is, control signals S/A<n:1>, CHE<n:1>, DLA<n:0>, DLB<n:0> always maintain "L".

The same operation as the above operation is also performed by changing the sense amplifier as the output side of data and the cache memory as the input side of data.

When, for example, as shown in FIG. 15, the Sense amplifier area includes (n+1) sense amplifiers and the Cache memory area includes (n+1) cache memories, the same operation as the above operation is performed (n+1) times by successively setting one of control signals S/A<n:0> and one of control signals CHE<n:0> to "H" to perform the data transfer from sense amplifiers S/A-0, . . . S/A-n to cache memories CHE-0, . . . CHE-n.

While control signal CHE<0> is set to "H" after control signal S/A<0> being set to "H" in the above operation, as shown in a waveform chart in FIG. 19, both may be set to "H" in the same timing. However, the state of cache memory CHE-0 on the input side of data is undefined and thus, it is desirable to connect cache memory CHE-0 on the input side of data to Data bus<0>-a after sense amplifier S/A-0 on the output side of data being connected to Data bus<0>-b.

Data Transfer from Sense Amplifier S/A-0 to Data Latch DLB-0 (FIG. 20)

First, control signal PRE1 is set to "L" to precharge Data bus<0>-b to power supply potential Vdd ("H"). Control signal PRE0 is always "H" and control signal φc is always "L". That is, Data bus<0>-a is not used for this data transfer. Then, control signal PRE1 is set to "H" to change Data bus<0>-b to a floating state.

Next, the transfer transistor in sense amplifier S/A-0 as the output side (sending side) of data is turned on by setting control signal S/A<0> to "H" to output data of sense amplifier S/A-0 to Data bus<0>-b.

When, for example, data latched in sense amplifier S/A-0 is "H" (corresponding to, for example, "1"), Data bus<0>-b maintains power supply potential Vdd, that is, "H". When data latched in sense amplifier S/A-0 is "L" (corresponding to, for example, "0"), by contrast, Data bus<0>-b is discharged to change from power supply potential Vdd to ground potential Vss, that is, "L".

Next, the transfer transistor in data latch DLB-0 as the input side (receiving side) of data is turned on by setting control signal DLB<0> to "H" to electrically connect data latch DLB-0 to Data bus<0>-b. As a result, data is transferred from sense amplifier S/A-0 to data latch DLB-0 via Data bus<0>-b.

When, for example, Data bus<0>-b maintains power supply potential Vdd ("H"), "H" (corresponding to, for example, "1") is transferred to data latch DLB-0. When Data bus<0>-b changes to ground potential Vss ("L"), "L" (corresponding to, for example, "0") is transferred to data latch DLB-0.

Then, control signals S/A<0>, DLB<0> are set to "L".

In the above operation, memories other than sense amplifier S/A-0 as the output side (sending side) of data and data latch DLB-0 as the input side (receiving side) of data are not electrically connected to Data bus<0>-b. That is, control signals S/A<n:1>, DLB<n:1>, DLA<n:0>, CHE<n:0> always maintain "L".

The same operation as the above operation is also performed by changing the sense amplifier as the output side of data and the data latch as the input side of data.

When, for example, as shown in FIG. 15, the Sense amplifier area includes (n+1) sense amplifiers and the Data latch B area includes (n+1) data latches, the same operation as the above operation is performed (n+1) times by successively setting one of control signals S/A<n:0> and one of control signals DLB<n:0> to "H" to perform the data transfer from sense amplifiers S/A-0, . . . S/A-n to data latches DLB-0, . . . DLB-n.

While control signal DLB<0> is set to "H" after control signal S/A<0> being set to "H" in the above operation, as shown in a waveform chart in FIG. 20, both may be set to "H" in the same timing. However, the state of data latch DLB-0 on the input side of data is undefined and thus, it is desirable to connect data latch DLB-0 on the input side of data to Data bus<0>-b after sense amplifier S/A-0 on the output side of data being connected to Data bus<0>-b.

According to the first embodiment and the modification thereof, as described above, a nonvolatile semiconductor memory performing the data transfer by the bus precharge method can realize a robust system consuming less power by dividing the data bus into two buses and charging the data bus on the output side of data up to (Vdd-Vth) and the data bus on the input side of data up to Vdd.

Because the data bus on the output side of data is charged from the data bus on the input side of data via a clamp transistor, a control signal to control charging of the data bus on the output side of data can be omitted. As a result, the number of control signals to control the data transfer can be reduced.

When no clamp transistor is present between the output side and the input side of data, power consumption can further be reduced because only one of two data buses needs to be charged. In addition, the data bus on the output side of data is charged only up to (Vdd-Vth) and thus, for example, the discharge rate (data transfer rate) when the data bus is discharged (when "L" is transferred) can be increased.

(2) Second Embodiment

In the first embodiment described above, the data bus on the output side of data is immediately determined to be "H" or "L" by a storage area (such as a sense amplifier, data latch, or cache memory) and so precharged only up to (Vpre-Vth). This is desirable in terms of power consumption, but is not desirable in terms of a fast precharge, because a relatively long time is needed for charging via a precharge switch and a clamp switch.

Thus, the second embodiment proposes a technology to precharge the data bus on the output side of data up to (Vpre-Vth) at high speed.

FIG. 21 shows a second embodiment.

The present example relates to movement of data between a cache memory CHE and a sense amplifier S/A.

Clamp transistor T is connected between Data bus<k>-a and Data bus<k>-b. Clamp transistor T is, for example, an N channel type FET and controls connection/disconnection between Data bus<k>-a and Data bus<k>-b. When, for example, control signal φc is "H(High)", clamp transistor T is turned on and Data bus<k>-a and Data bus<k>-b are electrically connected. When control signal φc is "L (Low)", clamp transistor T is turned off and Data bus<k>-a and Data bus<k>-b are electrically disconnected.

Cache memory CHE is connected to Data bus<k>-a and sense amplifier S/A is connected to Data bus<k>-b.

Precharge switches PSW0a, PSW0b are connected to Data bus<k>-a.

Precharge switch PSW0a supplies power supply potential Vdd to Data bus<k>-a during precharging. If, for example, precharge switch PSW0a is a P channel type FET, precharge switch PSW0a is turned on by control signal PRE0a being changed to "L". Therefore, power supply potential Vdd is transferred to Data bus<k>-a via precharge switch PSW0a.

Precharge switch PSW0b supplies (Vdd-Vth) to Data bus<k>-a during precharging. If, for example, precharge switch PSW0b is an N channel type FET, precharge switch PSW0b is turned on by control signal PRE0b being changed to "H". Therefore, (Vdd-Vth) is transferred to Data bus<k>-a via precharge switch PSW0b.

Vth is the threshold of precharge switch PSW0b. The threshold of precharge switch PSW0b is desirably equal to the threshold of clamp transistor T (common threshold).

Precharge switches PSW1a, PSW1b are connected to Data bus<k>-b.

Precharge switch PSW1a supplies power supply potential Vdd to Data bus<k>-b during precharging. If, for example, precharge switch PSW1a is a P channel type FET, precharge switch PSW1a is turned on by control signal PRE1a being changed to "L". Therefore, power supply potential Vdd is transferred to Data bus<k>-b via precharge switch PSW1a.

Precharge switch PSW1b supplies (Vdd-Vth) to Data bus<k>-b during precharging. If, for example, precharge switch PSW1b is an N channel type FET, precharge switch PSW1b is turned on by control signal PRE1b being changed to "H". Therefore, (Vdd-Vth) is transferred to Data bus<k>-b via precharge switch PSW1b.

Vth is the threshold of precharge switch PSW1b. The threshold of precharge switch PSW1b is desirably equal to the threshold of clamp transistor T (common threshold). Also, the threshold of precharge switch PSW0b is desirably equal to the threshold of precharge switch PSW1b.

Features of operation in the second embodiment are as described below.

When data is transferred from cache memory CHE to sense amplifier S/A, Data bus<k>-b as the input side (receiving side) of data is precharged up to power supply potential Vdd. That is, control signal PRE1a is set to "L" to turn precharge switch PSW1a on. At this point, precharge switch PSW1b may be On or Off.

Also, control signal φc is set to "H" to turn clamp transistor T on.

Further, control signal PRE0a is set to "H" to turn precharge switch PSW0a connected to Data bus<k>-a as the output side (sending side) of data off. In parallel therewith, precharge switch PSW0b is turned on. That is, Data bus<k>-a as the output side of data is precharged via a first path passing through precharge switch PSW1a and clamp transistor T and a second path passing through precharge switch PSW0b.

Therefore, Data bus<k>-a as the output side of data is precharged equally as fast as Data bus<k>-b as the input side of data is precharged.

Data bus<k>-a as the output side of data is precharged up to a value lower than power supply potential Vdd, that is, up to (Vdd-Vth). Vth is the threshold of clamp transistor T and also the threshold of precharge switch PSW0b.

However, as described above, Data bus<k>-a as the output side of data is immediately determined to be "H" or "L" by data output from cache memory CHE, causing no problem in data transfer.

Therefore, when data is transferred from cache memory CHE to sense amplifier S/A, lower power consumption can be attempted to achieve by reducing the amount of charge of Data bus<k>-a as the output side of data. Also, faster precharging can be achieved by precharging Data bus<k>-a through precharge switch PSW0b.

Similarly, when data is transferred from sense amplifier S/A to cache memory CHE, Data bus<k>-a as the input side (receiving side) of data is precharged up to power supply potential Vdd. That is, control signal PRE0 is set to "L" to turn precharge switch PSW0a on. At this point, precharge switch PSW0b may be On or Off.

Also, control signal φc is set to "H" to turn clamp transistor T on.

Further, control signal PRE1a is set to "H" to turn precharge switch PSW1a connected to Data bus<k>-b as the output side (sending side) of data off. In parallel therewith, precharge switch PSW1b is turned on. That is, Data bus<k>-b as the output side of data is precharged via a first path passing through precharge switch PSW0a and clamp transistor T and a second path passing through precharge switch PSW1b.

Therefore, Data bus<k>-b as the output side of data is precharged equally as fast as Data bus<k>-a as the input side of data is precharged.

Data bus<k>-b as the output side of data is precharged up to a value lower than power supply potential Vdd, that is, up to (Vdd-Vth). Vth is the threshold of clamp transistor T and also the threshold of precharge switch PSW1b.

However, as described above, Data bus<k>-b as the output side of data is immediately determined to be "H" or "L" by data output from sense amplifier S/A, causing no problem in data transfer.

Therefore, when data is transferred from sense amplifier S/A to cache memory CHE, lower power consumption can be attempted to achieve by reducing the amount of charge of Data bus<k>-b as the output side of data. Also, faster precharging can be achieved by precharging Data bus<k>-b through precharge switch PSW1b.

FIG. 22 shows a modification of the second embodiment.

When compared with the second embodiment, the modification is characterized in that data latch DLA is connected to Data bus<k>-a and data latch DLB is connected to Data bus<k>-b. Otherwise, the modification is the same as the second embodiment. Therefore, the same reference numerals are attached to the same elements in FIG. 22 as those in FIG. 21 to omit a detailed description thereof.

In the present example, cache memory CHE and data latch DLA are connected to Data bus<k>-a and data latch DLB and sense amplifier S/A are connected to Data bus<k>-b. Therefore, 12 combinations can be formed by selecting two memories from four memories via Data bus<k>-a/Data bus<k>-b.

Data Transfer Between Cache Memory CHE and Data Latch DLA (Two Combinations)

In this case, Data bus<k>-a as the output side (sending side) or the input side (receiving side) of data is precharged up to power supply potential Vdd. That is, control signal PRE0a is set to "L" to turn precharge switch PSW0a on.

Also, control signal φc is set to "L" to turn clamp transistor T off.

Further, control signal PRE1a is set to "H" and control signals PRE0b, PRE1b are set to "L" to turn precharge switches PSW1a, PSW0b, PSW1b independent of data transfer off.

Thus, when data transfer is performed between cache memory CHE and data latch DLA, that is, clamp transistor T is not present between the output side of data and the input side of data, lower power consumption can be achieved by charging only one short Data bus<k>-a used for data transfer.

Data Transfer Between Data Latch DLB and Sense Amplifier S/A (Two Combinations)

In this case, Data bus<k>-b as the output side (sending side) or the input side (receiving side) of data is precharged up to power supply potential Vdd. That is, control signal PRE1a is set to "L" to turn precharge switch PSW1a on.

Also, control signal φc is set to "L" to turn clamp transistor T off.

Further, control signal PRE0a is set to "H" and control signals PRE0b, PRE1b are set to "L" to turn precharge switches PSW0a, PSW0b, PSW1b independent of data transfer off.

Thus, when data transfer is performed between data latch DLB and sense amplifier S/A, that is, clamp transistor T is not present between the output side and the input side of data, lower power consumption can be achieved by charging only one short Data bus<k>-b used for data transfer.

Data Transfer (Two Combinations) from Cache Memory CHE to Data Latch DLB or Sense Amplifier S/A and Data Transfer (Two Combinations) from Data Latch DLA to Data Latch DLB or Sense Amplifier S/A In these data transfers, Data bus<k>-b as the input side (receiving side) of data is precharged up to power supply potential Vdd. That is, control signal PRE1a is set to "L" to turn precharge switch PSW1a on. At this point, precharge switch PSW1b may be On or Off.

Also, control signal φc is set to "H" to turn clamp transistor T on.

Further, control signal PRE0a is set to "H" to turn precharge switch PSW0a connected to Data bus<k>-a as the output side (sending side) of data off. That is, control signal PRE0b is set to "H" to turn precharge switch PSW0b on.

That is, Data bus<k>-a as the output side of data is precharged via a first path passing through precharge switch PSW1a and clamp transistor T and a second path passing through precharge switch PSW0b.

Therefore, Data bus<k>-a as the output side of data is precharged equally as fast as Data bus<k>-b as the input side of data is precharged.

Data bus<k>-a as the output side of data is precharged up to a value lower than power supply potential Vdd, that is, up to (Vdd-Vth). Vth is the threshold of clamp transistor T and also the threshold of precharge switch PSW0b.

However, Data bus<k>-a as the output side of data is immediately determined to be "H" or "L" by data output from cache memory CHE or data latch DLA, causing no problem in data transfer.

Therefore, when data is transferred from cache memory CHE or data latch DLA to data latch DLB or sense amplifier S/A, lower power consumption can be attempted to achieve by reducing the amount of charge of Data bus<k>-a as the output side of data. Also, faster precharging can be achieved by precharging Data bus<k>-a through precharge switch PSW0b.

Data Transfer (Two Combinations) from Sense Amplifier S/A to Data Latch DLA or Cache Memory CHE and Data Transfer (Two Combinations) from Data Latch DLB to Data Latch DLA or Cache Memory CHE In these data transfers, Data bus<k>-a as the input side (receiving side) of data is precharged up to power supply potential Vdd. That is, control signal PRE0a is set to "L" to turn precharge switch PSW0a on. At this point, precharge switch PSW0b may be On or Off.

Also, control signal φc is set to "H" to turn clamp transistor T on.

Further, control signal PRE1a is set to "H" to turn precharge switch PSW1a connected to Data bus<k>-b as the output side (sending side) of data off. That is, control signal PRE1b is set to "H" to turn precharge switch PSW1b on.

That is, Data bus<k>-b as the output side of data is precharged via a first path passing through precharge switch PSW0a and clamp transistor T and a second path passing through precharge switch PSW1b.

Therefore, Data bus<k>-b as the output side of data is precharged equally as fast as Data bus<k>-a as the input side of data is precharged.

Data bus<k>-b as the output side of data is precharged up to a value lower than power supply potential Vdd, that is, up to (Vdd-Vth). Vth is the threshold of clamp transistor T and also the threshold of precharge switch PSW1b.

However, Data bus<k>-b as the output side of data is immediately determined to be "H" or "L" by data output from sense amplifier S/A or data latch DLB, causing no problem in data transfer.

Therefore, when data is transferred from sense amplifier S/A or data latch DLB to data latch DLA or cache memory CHE, lower power consumption can be attempted to achieve by reducing the amount of charge of Data bus<k>-b as the output side of data. Also, faster precharging can be achieved by precharging Data bus<k>-b through precharge switch PSW1b.

In the present example, the number of memories connected to Data bus<k>-a is two (cache memory CHE and data latch DLA) and the number of memories connected to Data bus<k>-b is also two (data latch DLB and sense amplifier S/A), but the present example is not limited to such an example.

For example, as shown in FIG. 23, (t+1) data latches DLA-0, . . . DLA-t may be connected to Data bus<k>-a by increasing the number of data latches connected to Data bus<k>-a or (s+1) data latches DLA-0, . . . DLA-s may be connected to Data bus<k>-b by increasing the number of data latches connected to Data bus<k>-b. t and s are both natural numbers.

In FIGS. 21 to 23, each of cache memory CHE, data latches DLA (DLA-0, . . . DLA-t), data latches DLB (DLB-0, . . . DLB-s), and sense amplifier S/A needs to contain one memory or more, but in general, more than one memory is contained.

Figure 24:
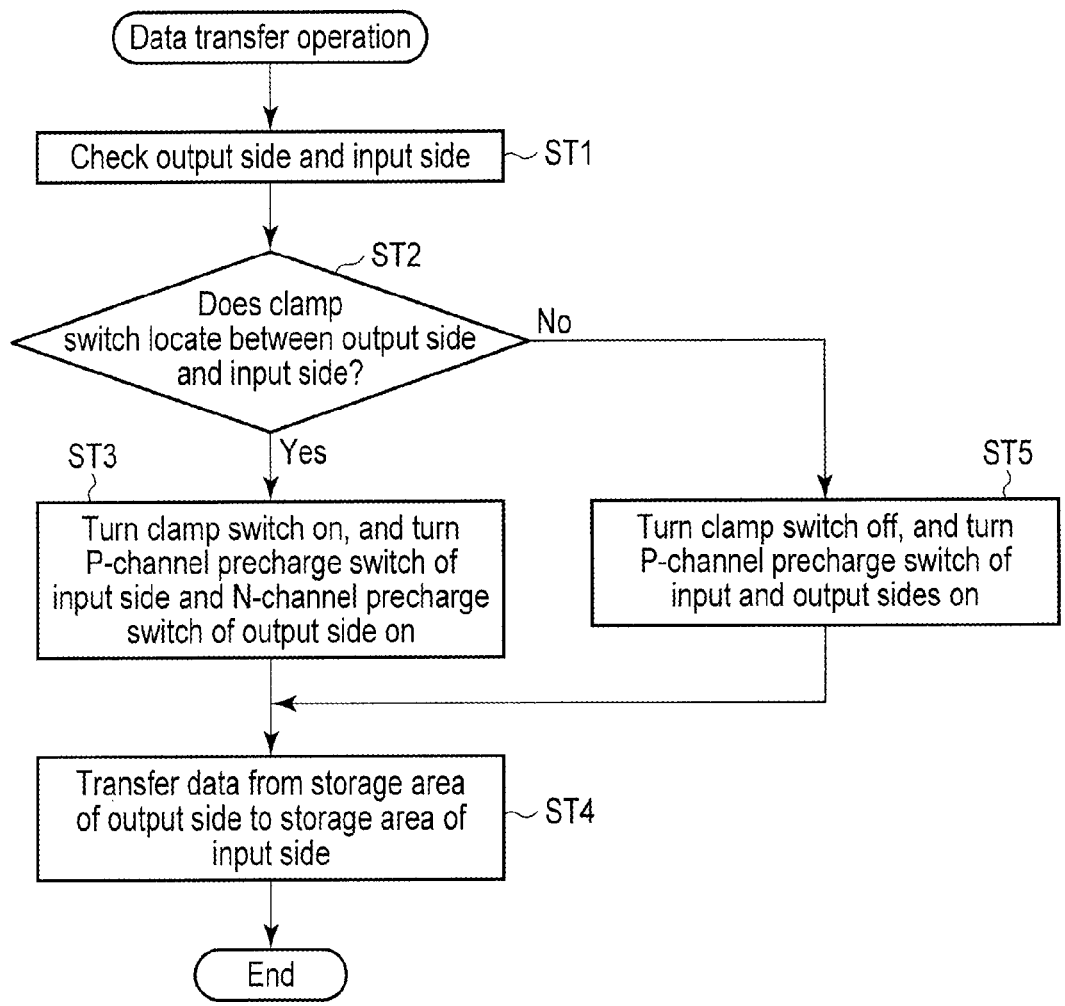
FIG. 24 is a flow chart showing the data transfers according to the second embodiment and the modification thereof.

FIG. 24 is a flow chart of a data transfer operation.

The flow chart is a generalization of the data transfer operation of the second embodiment and the modification thereof described above and is executed by, for example, control circuit 14 in FIG. 1 or FIG. 2.

First, the output side (sending side) and the input side (receiving side) of data are checked (step ST1). Also, whether a clamp switch (clamp transistor) locates between the output side and the input side of data is checked (step ST2).

If the clamp switch locates between the output side and the input side of data, the clamp switch is turned on and the P-channel precharge switch (FET) on the input side of data and the N-channel precharge switch (FET) on the output side of data are each turned on (step ST3). Then, data is transferred from a Storage area on the output side of data to a Storage area on the input side of data (step ST4).

If the clamp switch does not locate between the output side and the input side of data, the clamp switch is turned off and the P-channel precharge switch as the output side or the input side of data is turned on (step ST5).

Then, data is transferred from a Storage area on the output side of data to a Storage area on the input side of data (step ST4).

Next, an application example of the second embodiment and the modification thereof will be described.

Here, a case when the data transfer operation in the second embodiment and the modification thereof is applied to the nonvolatile semiconductor memory shown in FIGS. 1 and 2 will be described.

Figure 25:
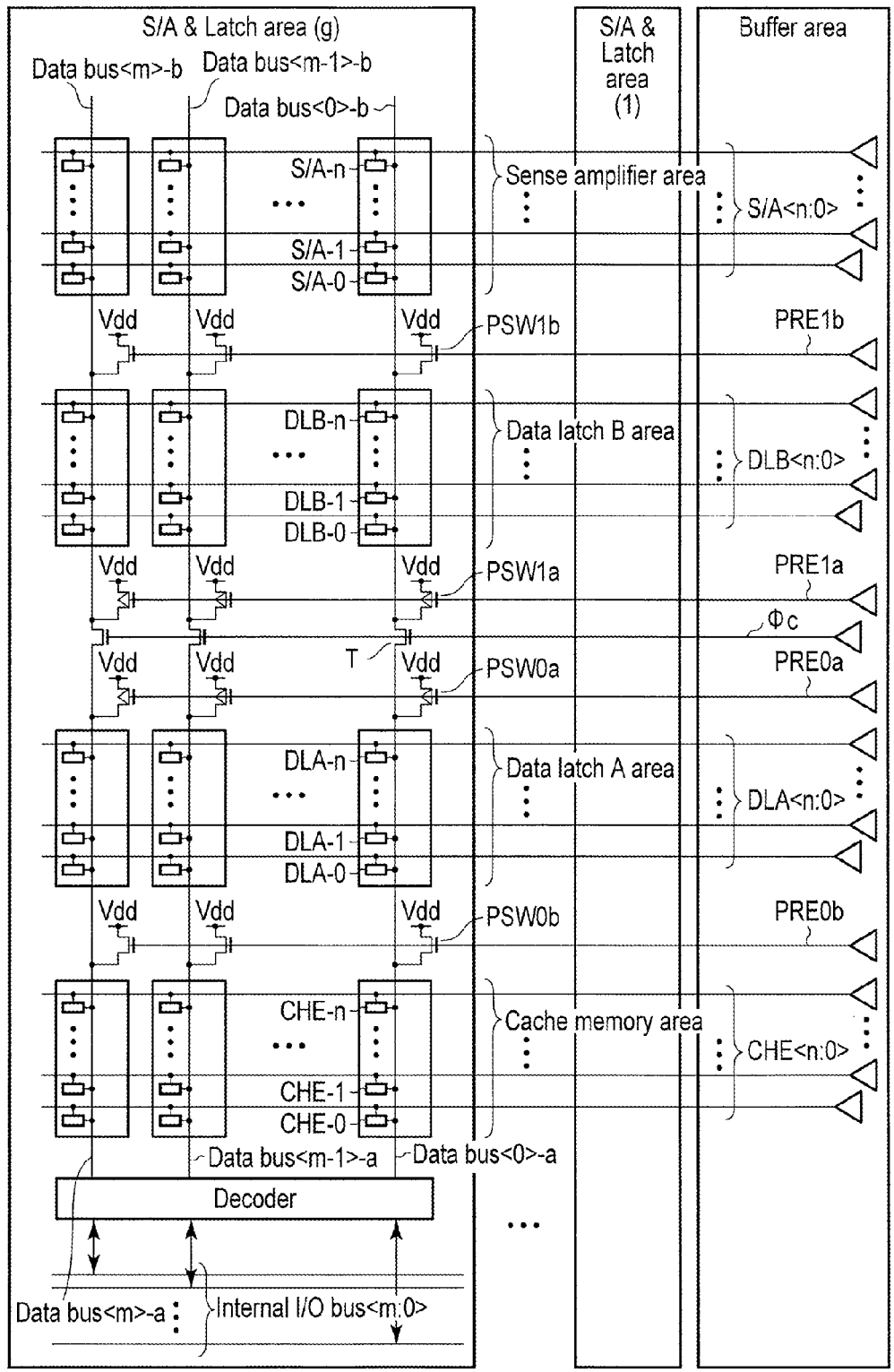
FIG. 25 is a diagram showing the S/A & Latch area and the Buffer area.

FIG. 25 shows S/A & Latch areas (1), . . . (g) and a Buffer area.

S/A & Latch areas (1), . . . (g) have mutually the same circuit configuration.

The following description will be provided by taking, for example, S/A & Latch area (g) as an example.

S/A & Latch area (g) includes a Sense amplifier area, Data latch B area, Data latch A area, and Cache memory area. The number of these areas changes depending on the number of bits made to be stored in one memory cell. When, for example, 2 bits are made to be stored in one memory cell, as shown in FIG. four areas, that is, the Sense amplifier area, Data latch B area, Data latch A area, and Cache memory area are provided in S/A & Latch area (g).

S/A & Latch area (g) includes Data buses<m:0> connected to respective Internal I/O buses<m:0>. Precharge switch (P channel type FET) PSW0a and precharge switch (N channel type FET) PSW0b are connected to each of Data buses<m:0>-a and precharge switch (P channel type FET) PSW1a and precharge switch (N channel type FET) PSW1b are connected to each of Data buses<m:0>-b.

Clamp transistor T is connected between Data buses<m:0>-a and Data buses<m:0>-b. Clamp transistor T is, for example, an N channel type FET and controls connection/disconnection between Data buses<m:0>-a and Data buses<m:0>-b based on control signal φc.

Precharge switch (P channel type FET) PSW0a supplies power supply potential Vdd to Data buses<m:0>-a as a precharge potential based on control signal PRE0a and precharge switch (N channel type FET) PSW0b supplies (Vdd-Vth) to Data buses<m:0>-a as a precharge potential based on control signal PRE0b.

Also, precharge switch (P channel type FET) PSW1a supplies power supply potential Vdd to Data buses<m:0>-b as a precharge potential based on control signal PRE1a and precharge switch (N channel type FET) PSW1b supplies (Vdd-Vth) to Data buses<m:0>-b as a precharge potential based on control signal PRE1b.

An example of the Cache memory area and Data latch A area connected to Data buses<m:0>-a and the Sense amplifier area and Data latch B area connected to Data buses<m:0>-b will be described.

For example, Data bus<0> is taken as an example.

(n+1) sense amplifiers S/A-0, . . . S/A-n in the Sense amplifier area are commonly connected to Data bus<0>-b. Sense amplifiers S/A-0, . . . S/A-n only need to have functions to temporarily hold and amplify data and the circuit configuration thereof is not specifically limited. Electrical connection of amplifiers S/A-0, . . . S/A-n to Data bus<0>-b is controlled by respective control signals S/A<n:0> from the Buffer area.

(n+1) data latches DLB-0, . . . DLB-n in the Data latch B area are commonly connected to Data bus<0>-b. Data latches DLB-0, . . . DLB-n only need to have a function to temporarily hold data and the circuit configuration thereof is not specifically limited. Electrical connection of data latches DLB-0, . . . DLB-n to Data bus<0>-b is controlled by respective control signals DLB<n:0> from the Buffer area.

(n+1) data latches DLA-0, . . . DLA-n in the Data latch A area are commonly connected to Data bus<0>-a. Data latches DLA-0, . . . DLA-n only need to have a function to temporarily hold data and the circuit configuration thereof is not specifically limited. Electrical connection of data latches DLA-0, . . . DLA-n to Data bus<0>-a is controlled by respective control signals DLA<n:0> from the Buffer area.

(n+1) cache memories CHE-0, . . . CHE-n in the Cache memory area are commonly connected to Data bus<0>-a. Cache memories CHE-0, . . . CHE-n only need to have a function to temporarily hold data and the circuit configuration thereof is not specifically limited.

Electrical connection of cache memories CHE-0, . . . CHE-n to Data bus<0>-a is controlled by respective control signals CHE<n:0> from the Buffer area.

Figure 26:
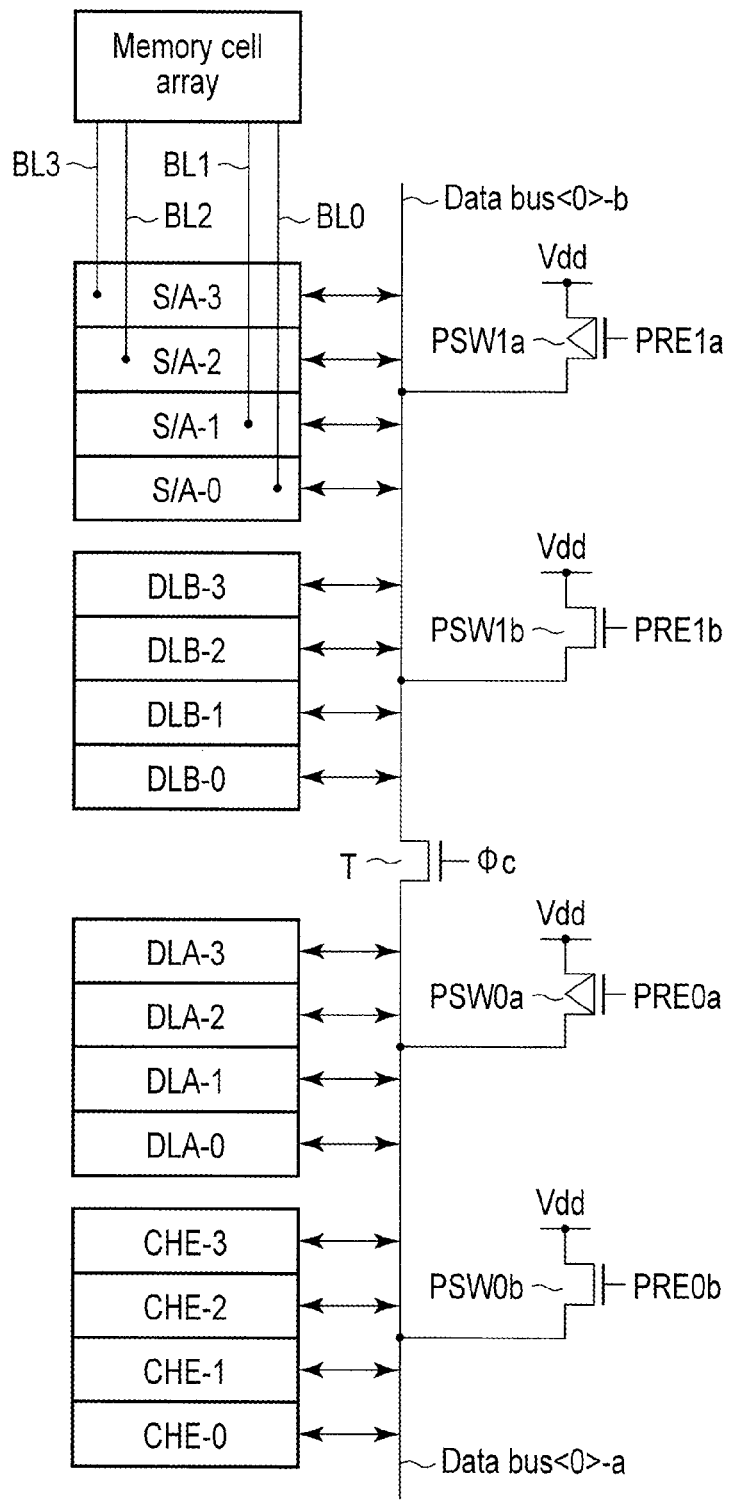
FIG. 26 is a diagram showing an example of the S/A & Latch area.

FIG. 26 shows an example of the memory connected to Data bus<0>-a and Data bus<0>-b.

The present example corresponds to n=3 in FIG. 25.

Sense amplifiers S/A-0, . . . S/A-3 are connected to memory cells in the memory cell array via bit lines BL0, . . . BL3 respectively.

When control signal PRE0a is "L(low)", P channel type precharge switch PSW0a is turned on and Data bus<0>-a is precharged to power supply potential Vdd. When clamp transistor T and precharge switch PSW1b are turned on and precharge switches PSW1a, PSW0b are turned off, Data bus<0>-b is precharged to (Vdd-Vth).

When control signal PRE0a changes from "L (low)" to "H(high)", P channel type precharge switch PSW0a is turned off. Thus, Data bus<0>-a changes to a floating state at the precharge potential (power supply potential Vdd) and Data bus<0>-b changes to a floating state at (Vdd-Vth).

When control signal PRE1a is "L(low)", P channel type precharge switch PSW1a is turned on and Data bus<0>-b is precharged to power supply potential Vdd. When clamp transistor T and precharge switch PSW0b are turned on and precharge switches PSW0a, PSW1b are turned off, Data bus<0>-a is precharged to (Vdd-Vth).

When control signal PRE1a changes from "L (low)" to "H(high)", P channel type precharge switch PSW1a is turned off. Thus, Data bus<0>-b changes to a floating state at the precharge potential (power supply potential Vdd) and Data bus<0>-a changes to a floating state at (Vdd-Vth).

As an example of the sense amplifier, Data latch A, Data latch B, and cache memory, circuits shown in FIGS. 5 to 8 can be cited. As Storage area 21 shown in FIGS. 5 to 8, for example, a static latch circuit shown in FIG. 9 can be shown.

FIGS. 27 to 30 show a data transfer example of the non-volatile semiconductor memory in FIG. 25.

Data Transfer from Cache Memory CHE-0 to Sense Amplifier S/A-0 (FIG. 27)

First, control signal PRE1a is set to "L" and control signals PRE0b, φc are set to "H". Control signal PRE0a is always "H" and control signal PRE1b is always "L". Accordingly, Data bus<0>-b is precharged to power supply potential Vdd ("H") and Data bus<0>-a is precharged to (Vdd-Vth). Then, control signal PRE1a is set to "H" and control signal PRE0b is set to "L" to change Data bus<0>-a and Data bus<0>-b to a floating state.

Next, the transfer transistor in cache memory CHE-0 as the output side (sending side) of data is turned on by setting control signal CHE<O> to "H" to output data in cache memory CHE-0 to Data bus<0>-a.

When, for example, data latched in cache memory CHE-0 is "H" (corresponding to, for example, "1"), Data bus<0>-a maintains (Vdd-Vth), that is, "H". At this point, Data bus<0>-b maintains power supply potential Vdd, that is, "H".

When data latched in cache memory CHE-0 is "L" (corresponding to, for example, "0"), by contrast, Data bus<0>-a is discharged to change from (Vdd-Vth) to ground potential Vss, that is, "L". At this point, Data bus<0>-b also changes from power supply potential Vdd to ground potential Vss.

Next, the transfer transistor in sense amplifier S/A-0 as the input side (receiving side) of data is turned on by setting control signal S/A<0> to "H" to electrically connect sense amplifier S/A-0 to Data bus<0>-b. As a result, data output from cache memory CHE-0 to Data bus<0>-a is further input into sense amplifier S/A-0 via Data bus<0>-b.

When, for example, Data bus<0>-b maintains power supply potential Vdd ("H"), "H" (corresponding to, for example, "1") is transferred to sense amplifier S/A-0. When Data bus<0>-b change to ground potential Vss ("L"), "L" (corresponding to, for example, "0") is transferred to sense amplifier S/A-0.

Then, control signals φc, CHE<0>, S/A<0> are set to "L".

In the above operation, memories other than cache memory CHE-0 as the output side (sending side) of data and sense amplifier S/A-0 as the input side (receiving side) of data are not electrically connected to Data bus<0>-a and Data bus<0>-b. That is, control signals CHE<n:1>, S/A<n:1>, DLA<n:0>, DLB<n:0> always maintain "L".

The same operation as the above operation is also performed by changing the cache memory as the output side of data and the sense amplifier as the input side of data.

When, for example, as shown in FIG. 25, the Cache memory area includes (n+1) cache memories and the Sense amplifier area includes (n+1) sense amplifiers, the same operation as the above operation is performed (n+1) times by successively setting one of control signals CHE<n:0> and one of control signals S/A<n:0> to "H" to perform the data transfer from cache memories CHE-0, . . . CHE-n to sense amplifiers S/A-0, . . . S/A-n.

While control signal S/A<0> is set to "H" after control signal CHE<0> being set to "H" in the above operation, as shown in a waveform chart in FIG. 27, both may be set to "H" in the same timing. However, the state of sense amplifier S/A-0 on the input side of data is undefined and thus, it is desirable to connect sense amplifier S/A-0 on the input side of data to Data bus<0>-b after cache memory CHE-0 on the output side of data being connected to Data bus<0>-a.

Data Transfer from Cache Memory CHE-0 to Data Latch DLA-0 (FIG. 28)

First, control signal PRE0a is set to "L" to precharge Data bus<0>-a to power supply potential Vdd ("H"). Control signal PRE1a is always "H" and control signals φc, PRE0b, PRE1b are always "L". That is, Data bus<0>-b is not used for this data transfer. Then, control signal PRE0a is set to "H" to change Data bus<0>-a to a floating state.

Next, the transfer transistor in cache memory CHE-0 as the output side (sending side) of data is turned on by setting control signal CHE<O> to "H" to output data in cache memory CHE-0 to Data bus<0>-a.

When, for example, data latched in cache memory CHE-0 is "H" (corresponding to, for example, "1"), Data bus<0>-a maintains power supply potential Vdd, that is, "H". When data latched in cache memory CHE-0 is "L" (corresponding to, for example, "0"), by contrast, Data bus<0>-a is discharged to change from power supply potential Vdd to ground potential Vss, that is, "L".

Next, the transfer transistor in data latch DLA-0 as the input side (receiving side) of data is turned on by setting control signal DLA<0> to "H" to electrically connect data latch DLA-0 to Data bus<0>-a. As a result, data is transferred from cache memory CHE-0 to data latch DLA-0 via Data bus<0>-a.

When, for example, Data bus<0>-a maintains power supply potential Vdd ("H"), "H" (corresponding to, for example, "1") is transferred to data latch DLA-0. When Data bus<0>-a changes to ground potential Vss ("L"), "L" (corresponding to, for example, "0") is transferred to data latch DLA-0.

Then, control signals CHE<0>, DLA<O> are set to "L".

In the above operation, memories other than cache memory CHE-0 as the output side (sending side) of data and data latch DLA-0 as the input side (receiving side) of data are not electrically connected to Data bus<0>-a. That is, control signals CHE<n:1>, DLA<n:1>, DLB<n:0>, S/A<n:0> always maintain "L".

The same operation as the above operation is also performed by changing the cache memory as the output side of data and the data latch as the input side of data.

When, for example, as shown in FIG. 25, the Cache memory area includes (n+1) cache memories and the Data latch A area includes (n+1) data latches, the same operation as the above operation is performed (n+1) times by successively setting one of control signals CHE<n:0> and one of control signals DLA<n:0> to "H" to perform the data transfer from cache memories CHE-0, . . . CHE-n to data latches DLA-0, . . . DLA-n.

While control signal DLA<0> is set to "H" after control signal CHE<0> being set to "H" in the above operation, as shown in a waveform chart in FIG. 28, both may beset to "H"

in the same timing. However, the state of data latch DLA-0 on the input side of data is undefined and thus, it is desirable to connect data latch DLA-0 on the input side of data to Data bus<0>-a after cache memory CHE-0 on the output side of data being connected to Data bus<0>-a.

Figure 29:
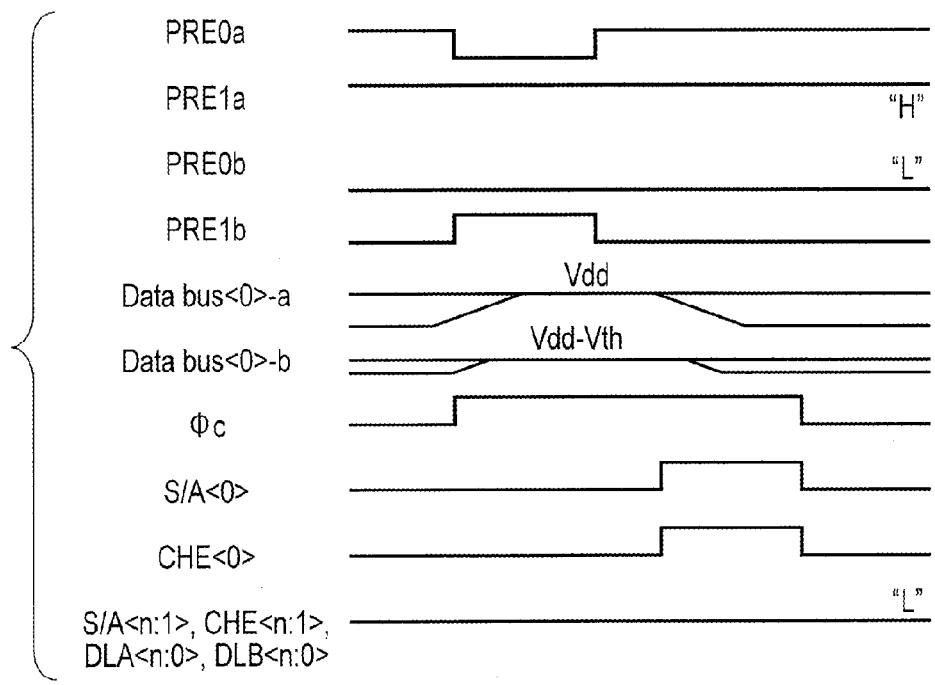

Data Transfer from Sense Amplifier S/A-0 to Cache Memory CHE-0 (FIG. 29)

First, control signal PRE0a is set to "L" and control signals ϕc, PRE1b are set to "H". Control signal PRE1a is always "H" and control signal PRE0b is always "L". Accordingly, Data bus<0>-a is precharged to power supply potential Vdd ("H") and Data bus<0>-b is precharged to (Vdd-Vth). Then, control signal PRE0a is set to "H" and control signal PRE1b is set to "L" to change Data bus<0>-a and Data bus<0>-b to a floating state.

Next, the transfer transistor in sense amplifier S/A-0 as the output side (sending side) of data is turned on by setting control signal S/A<0> to "H" to output data of sense amplifier S/A-0 to Data bus<0>-b.

When, for example, data latched in sense amplifier S/A-0 is "H" (corresponding to, for example, "1"), Data bus<0>-b maintains (Vdd-Vth), that is, "H". At this point, Data bus<0>-a maintains power supply potential Vdd, that is, "H".

When data latched in sense amplifier S/A-0 is "L" (corresponding to, for example, "0"), by contrast, Data bus<0>-b is discharged to change from (Vdd-Vth) to ground potential Vss, that is, "L". At this point, Data bus<0>-a also changes from power supply potential Vdd to ground potential Vss.

Next, the transfer transistor in cache memory CHE-0 as the input side (receiving side) of data is turned on by setting control signal CHE<0> to "H" to electrically connect cache memory CHE-0 to Data bus<0>-a. As a result, the data output from sense amplifier S/A-0 to Data bus<0>-b is further input into cache memory CHE-0 via Data bus<0>-a.

When, for example, Data bus<0>-a maintains power supply potential Vdd ("H"), "H" (corresponding to, for example, "1") is transferred to cache memory CHE-0. When Data bus<0>-a changes to ground potential Vss ("L"), "L" (corresponding to, for example, "0") is transferred to cache memory CHE-0.

Then, control signals (ϕc, S/A<0>, CHE<0> are set to "L".

In the above operation, memories other than sense amplifier S/A-0 as the output side (sending side) of data and cache memory CHE-0 as the input side (receiving side) of data are not electrically connected to Data bus<0>-a and Data bus<0>-b. That is, control signals S/A<n:1>, CHE<n:1>, DLA<n:0>, DLB<n:0> always maintain "L".

The same operation as the above operation is also performed by changing the sense amplifier as the output side of data and the cache memory as the input side of data.

When, for example, as shown in FIG. 25, the Sense amplifier area includes (n+1) sense amplifiers and the Cache memory area includes (n+1) cache memories, the same operation as the above operation is performed (n+1) times by successively setting one of control signals S/A<n:0> and one of control signals CHE<n:0> to "H" to perform the data transfer from sense amplifiers S/A-0, . . . S/A-n to cache memories CHE-0, . . . CHE-n.

While control signal CHE<O> is set to "H" after control signal S/A<0> being set to "H" in the above operation, as shown in a waveform chart in FIG. 29, both may be set to "H" in the same timing. However, the state of cache memory CHE-0 on the input side of data is undefined and thus, it is desirable to connect cache memory CHE-0 on the input side of data to Data bus<0>-a after sense amplifier S/A-0 on the output side of data being connected to Data bus<0>-b.

Figure 30:
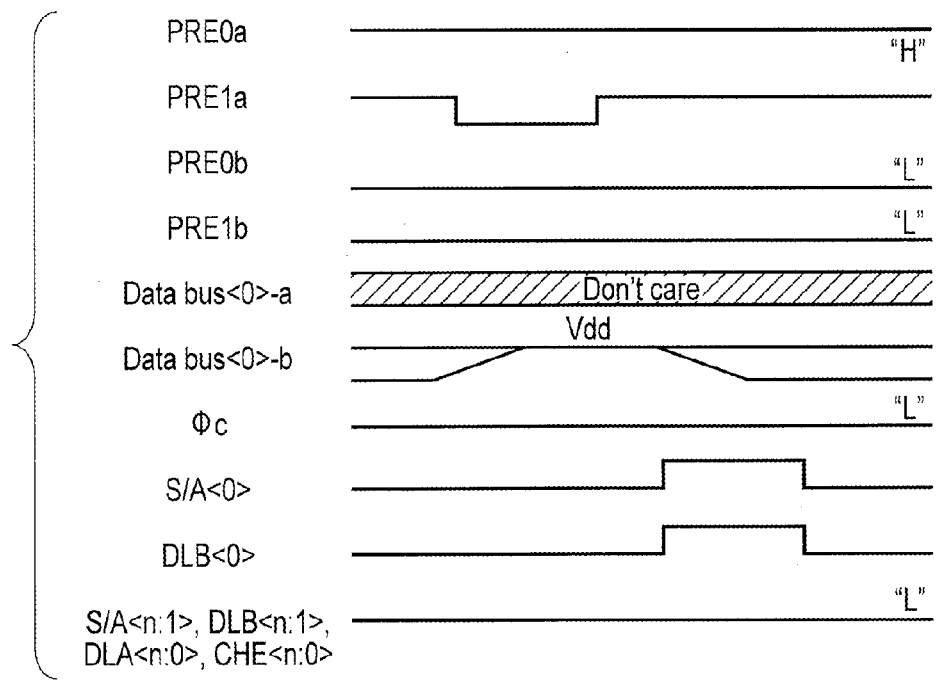

Data Transfer from Sense Amplifier S/A-0 to Data Latch DLB-0 (FIG. 30)

First, control signal PRE1a is set to "L" to precharge Data bus<0>-b to power supply potential Vdd ("H"). Control signal PRE0a is always "H" and control signals ϕc, PRE0b, PRE1b are always "L". That is, Data bus<0>-a is not used for this data transfer. Then, control signal PRE1a is set to "H" to change Data bus<0>-b to a floating state.

Next, the transfer transistor in sense amplifier S/A-0 as the output side (sending side) of data is turned on by setting control signal S/A<0> to "H" to output data of sense amplifier S/A-0 to Data bus<0>-b.

When, for example, data latched in sense amplifier S/A-0 is "H" (corresponding to, for example, "1"), Data bus<0>-b maintains power supply potential Vdd, that is, "H". When data latched in sense amplifier S/A-0 is "L" (corresponding to, for example, "0"), by contrast, Data bus<0>-b is discharged to change from power supply potential Vdd to ground potential Vss, that is, "L".

Next, the transfer transistor in data latch DLB-0 as the input side (receiving side) of data is turned on by setting control signal DLB<0> to "H" to electrically connect data latch DLB-0 to Data bus<0>-b. As a result, data is transferred from sense amplifier S/A-0 to data latch DLB-0 via Data bus<0>-b.

When, for example, Data bus<0>-b maintains power supply potential Vdd ("H"), "H" (corresponding to, for example, "1") is transferred to data latch DLB-0. When Data bus<0>-b changes to ground potential Vss ("L"), "L" (corresponding to, for example, "0") is transferred to data latch DLB-0.

Then, control signals S/A<0>, DLB<0> are set to "L".

In the above operation, memories other than sense amplifier S/A-0 as the output side (sending side) of data and data latch DLB-0 as the input side (receiving side) of data are not electrically connected to Data bus<0>-b. That is, control signals S/A<n:1>, DLB<n:1>, DLA<n:0>, CHE<n:0> always maintain "L".

The same operation as the above operation is also performed by changing the sense amplifier as the output side of data and the data latch as the input side of data.

When, for example, as shown in FIG. 25, the Sense amplifier area includes (n+1) sense amplifiers and the Data latch B area includes (n+1) data latches, the same operation as the above operation is performed (n+1) times by successively setting one of control signals S/A<n:0> and one of control signals DLB<n:0> to "H" to perform the data transfer from sense amplifiers S/A-0, . . . S/A-n to data latches DLB-0, . . . DLB-n.

While control signal DLB<0> is set to "H" after control signal S/A<0> being set to "H" in the above operation, as shown in a waveform chart in FIG. 30, both may be set to "H" in the same timing. However, the state of data latch DLB-0 on the input side of data is undefined and thus, it is desirable to connect data latch DLB-0 on the input side of data to Data bus<0>-b after sense amplifier S/A-0 on the output side of data being connected to Data bus<0>-b.

According to the second embodiment and the modification thereof, as described above, a nonvolatile semiconductor memory performing the data transfer by the bus precharge method can realize a robust system consuming less power by dividing the data bus into two buses and charging the data bus on the output side of data up to (Vdd-Vth) and the data bus on the input side of data up to Vdd.

The data bus on the output side of data is charged via a first path from the precharge switch (P channel type FET) on the input side of data via a clamp transistor and a second path passing through the precharge switch (N channel type FET)

on the output side of data and thus, the data bus on the output side of data can be charged at high speed.

When no clamp transistor is present between the output side and the input side of data, power consumption can further be reduced because only one of two data buses needs to be charged. In addition, the data bus on the output side of data is charged only up to (Vdd-Vth) and thus, for example, the discharge rate (data transfer rate) when the data bus is discharged (when "L" is transferred) can be increased.

(3) Third Embodiment

In the first and second embodiments described above, the division number of the data bus in the S/A & Latch area (temporary storage area) is assumed to be 2. However, as described above, the division is not limited to 2.

FIG. 31 shows a third embodiment.

Data bus-a, Data bus-b, Data bus-c, and Data bus-d are connected in series by N channel type clamp transistors (FET) T0, T1, T2. On/Off of N channel type clamp transistors (FET) T0, T1, T2 is controlled by control signals φc0, φc1, φc2 respectively.

Precharge circuits P0, P1, P2, P3 are connected to Data bus-a, Data bus-b, Data bus-c, and Data bus-d respectively. Each of precharge circuits P0, P1, P2, P3 may contain a precharge switch (P channel type FET) shown in the first embodiment or two precharge switches (P channel type and N channel type FETs) shown in the second embodiment.

Cache memory CHE is connected to Data bus-a, data latch DLA is connected to Data bus-b, data latch DLB is connected to Data bus-c, and sense amplifier S/A is connected to Data bus-d.

Data buses among Data bus-a, Data bus-b, Data bus-c, and Data bus-d as the input side of data are precharged to a first potential (for example, Vdd). Data buses among Data bus-a, Data bus-b, Data bus-c, and Data bus-d as the output side of data are precharged to a second potential (for example, Vdd−(Vth×m)) lower than the first potential.

Vdd is the power supply potential, Vth is the threshold of N channel type clamp transistors, T0, T1, T2, and m is one of 1, 2, and 3.

What is described above can be generalized as shown below.

First to (n−1)-th N channel type clamp FETs connect first to n-th data buses in series. First to n-th precharge circuits are connected to the respective first to n-th data buses to precharge the first to n-th data buses. Further, first to n-th storage areas are connected to the respective first to n-th data buses. n is a natural number equal to or more than 2.

Then, data buses among the first to n-th data buses as the input side of data are precharged to a first potential. Also, data buses among the first to n-th data buses as the output side of data are precharged to a second potential lower than the first potential.

The data transfer operation is the same as in the first and second embodiment described above excluding the following point and thus, a detailed description thereof is omitted.

In the present example, when another data bus is arranged between a data bus as the input side of data and a data bus as the output side of data, the other data bus is precharged to one of the first and second potentials.

If, for example, FIG. 31 is taken as an example, when data is transferred from cache memory CHE to sense amplifier S/A, Data bus-a is precharged to (Vdd-Vth) and the remaining Data bus-b, Data bus-c, and Data bus-d are precharged to Vdd.

In place of the above operation, Data bus-a may be precharged to (Vdd-Vth×3), Data bus-b to (Vdd-Vth×2), Data bus-c to (Vdd-Vth), and Data bus-d to Vdd.

(4) Others

In the first to third embodiments described above, storage areas (cache memories, data latches, and sense amplifiers) may be connected to Data bus<0> via, as shown in FIGS. 32 to 39, an N channel type FET as a transfer gate or a P channel type FET and an N channel FET as transfer gates.

For example, FIG. 32 shows an example in which sense amplifier S/A-0 is connected to Data bus<0> via transfer gate (N channel type FET) TG-a. FIGS. 33 and 34 show examples in which data latches DLA-0, DLB-0 are connected to Data bus<0> via transfer gate (N channel type FET) TG-a. FIG. 35 shows an example in which cache memory CHE-0 is connected to Data bus<0> via transfer gate (N channel type FET) TG-a.

Transfer gate TG-a is an N channel type FET in these examples and thus, a data bus leak (precharge potential drop) on the input side of data profoundly affects an erroneous transfer of data. Thus, it is desirable to charge the data bus on the input side of data up to, for example, power supply potential Vdd.

For example, FIG. 36 shows an example in which sense amplifier S/A-0 is connected to Data bus<0> via transfer gate (P channel type and N channel type FETs) TG-a. FIGS. 37 and 38 show examples in which data latches DLA-0, DLB-0 are connected to Data bus<0> via transfer gate (P channel type and N channel type FETs) TG-a. FIG. 39 shows an example in which cache memory CHE-0 is connected to Data bus<0> via transfer gate (P channel type and N channel type FETs) TG-a.

Transfer gate TG-a is P channel type and N channel type FETs in these examples and thus, a data bus leak (precharge potential drop) on the input side of data does not affect an erroneous transfer of data significantly. However, even in such a case, it is desirable to charge the data bus on the input side of data up to power supply potential Vdd.

3. Conclusion

According to the embodiments described above, when data transfer when reading/writing is performed by the bus precharge method, lower power consumption can be attempted to achieve and also the number of control signals used to control the data transfer can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory comprising:
a memory cell array;
a temporary storage area which temporarily stores data in a read/write operation to the memory cell array; and
a control circuit which controls a transfer of the data in the temporary storage area,
wherein the temporary storage area comprises:
a first data bus;
a second data bus;
a clamp FET connected between the first data bus and the second data bus;
a first precharge FET connected between the first data bus and a first potential;

a second precharge FET connected between the second data bus and the first potential;
a first storage area connected to the first data bus; and
a second storage area connected to the second data bus,
wherein the control circuit is configured to:
generate a first precharge state in which the first data bus is precharged to the first potential and the second data bus is precharged to a second potential lower than the first potential, by turning the clamp FET and the first precharge FET on and turning the second precharge FET off, when the data is transferred from the second storage area to the first storage area;
change the first data bus and the second data bus from the first precharge state to a first floating state by turning the first precharge FET off;
output the data from the second storage area to the second data bus with the first floating state; and
input the data from the first data bus with the first floating state to the first storage area.

2. The memory of claim 1, wherein the control circuit is configured to:
generate a second precharge state in which the second data bus is precharged to the first potential and the first data bus is precharged to the second potential, by turning the clamp FET and the second precharge FET on and turning the first precharge FET off, when the data is transferred from the first storage area to the second storage area;
change the first data bus and the second data bus from the second precharge state to a second floating state by turning the second precharge FET off;
output the data from the first storage area to the first data bus with the second floating state; and
input the data from the second data bus with the second floating state to the second storage area.

3. The memory of claim 1, wherein the temporary storage area further comprises:
a third storage area connected to the first data bus; and
a fourth storage area connected to the second data bus.

4. The memory of claim 3, wherein the control circuit is configured to:
generate a second precharge state in which the second data bus is precharged to the first potential, by turning the second precharge FET on and turning the clamp FET and the first precharge FET off, when the data is transferred from the second storage area to the fourth storage area;
change the second data bus from the second precharge state to a second floating state by turning the second precharge FET off;
output the data from the second storage area to the second data bus with the second floating state; and
input the data from the second data bus with the second floating state to the fourth storage area.

5. The memory of claim 1, wherein the control circuit is configured to:
precharge the data bus of the first data bus and the second data bus as an input side of the data to the first potential and precharge the data bus as an output side of the data to the second potential.

6. The memory of claim 1, wherein the second potential has a value obtained by subtracting a threshold of the clamp FET from the first potential.

7. The memory of claim 1, wherein a timing to input the data into the first storage area is the same as or later than a timing to output the data from the second storage area.

8. The memory of claim 1, wherein:
the first storage area and the second storage area are arranged side by side in a first direction;
the first data bus and the second data bus extend in the first direction; and
control signals to control On/Off of the clamp FET, the first precharge FET, and the second precharge FET are supplied through a control line s extending in a second direction crossing the first direction.

9. The memory of claim 1, wherein the first storage area includes (n+1) first memories and the second storage area includes (n+1) second memories, wherein n is a natural number.

10. The memory of claim 1, wherein one of the first storage area and the second storage area is a sense amplifier area and the other is a cache memory area.

11. The memory of claim 1, wherein the temporary storage area further comprises:
a third precharge FET connected between the first data bus and the first potential; and
a fourth precharge FET connected between the second data bus and the first potential,
wherein the control circuit is configured to:
generate the first precharge state in which the first data bus is precharged to the first potential and the second data bus is precharged to the second potential lower than the first potential, by turning the clamp FET, the first precharge FET, and the fourth precharge FET on and turning the second precharge FET off, when the data is transferred from the second storage area to the first storage area;
change the first data bus and the second data bus from the first precharge state to a first floating state by turning the first precharge FET and the fourth precharge FET off;
output the data from the second storage area to the second data bus with the first floating state; and
input the data from the first data bus with the first floating state to the first storage area.

12. The memory of claim 11, wherein the control circuit is configured to:
generate the first precharge state in which the first data bus is precharged to the first potential and the second data bus is precharged to the second potential, by turning the clamp FET, the first precharge FET, and the fourth precharge FET on and turning the second precharge FET and the third precharge FET off, when the data is transferred from the second storage area to the first storage area.

13. The memory of claim 11, wherein the control circuit is configured to:
generate a second precharge state in which the second data bus is precharged to the first potential and the first data bus is precharged to the second potential, by turning the clamp FET, the second precharge FET, and the third precharge FET on and turning the first precharge FET off, when the data is transferred from the first storage area to the second storage area;d
change the first data bus and the second data bus from the second precharge state to a second floating state by turning the second precharge FET and the third precharge FET off;
output the data from the first storage area to the first data bus with the second floating state; and
input the data from the second data bus with the second floating state to the second storage area.

14. The memory of claim 11, wherein the temporary storage area further comprises:
   a third storage area connected to the first data bus; and
   a fourth storage area connected to the second data bus.

15. The memory of claim 14, wherein the control circuit is configured to:
   generate a second precharge state in which the second data bus is precharged to the first potential, by turning the second precharge FET on and turning the clamp FET, the first precharge FET, the third precharge FET, and the fourth precharge FET off, when the data is transferred from the second storage area to the fourth storage area;
   change the second data bus from the second precharge state to a second floating state by turning the second precharge FET off;
   output the data from the second storage area to the second data bus with the second floating state; and
   input the data from the second data bus with the second floating state to the fourth storage area.

16. The memory of claim 11, wherein the clamp FET, the third precharge FET, and the fourth precharge FET have a common threshold and the second potential has a value obtained by subtracting the common threshold from the first potential.

17. The memory of claim 11, wherein the clamp FET has an N channel type, each of the first and second precharge FETs has a P channel type, and each of the third and fourth precharge FETs has a N channel type.

18. The memory of claim 1, wherein the first storage area includes a first memory and a first transfer gate between the first memory and the first data bus, the second storage area includes a second memory and a second transfer gate between the second memory and the second data bus, and each of the first transfer gate and the second transfer gate includes an N channel type FET.

19. The memory of claim 1, wherein the first storage area includes a first memory and a first transfer gate between the first memory and the first data bus, the second storage area includes a second memory and a second transfer gate between the second memory and the second data bus, and each of the first transfer gate and the second transfer gate includes a P channel type FET and an N channel type FET connected in parallel.

20. The memory of claim 1, wherein the clamp FET has an N channel type, and each of the first and second precharge FETs has a P channel type.

* * * * *